US008415671B2

(12) United States Patent
Zhang

(10) Patent No.: US 8,415,671 B2
(45) Date of Patent: Apr. 9, 2013

(54) WIDE BAND-GAP MOSFETS HAVING A HETEROJUNCTION UNDER GATE TRENCHES THEREOF AND RELATED METHODS OF FORMING SUCH DEVICES

(75) Inventor: Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 427 days.

(21) Appl. No.: 12/761,518

(22) Filed: Apr. 16, 2010

(65) Prior Publication Data
US 2011/0254010 A1 Oct. 20, 2011

(51) Int. Cl.
*H01L 29/772* (2006.01)
*H01L 21/336* (2006.01)
*H01L 29/24* (2006.01)
*H01L 21/331* (2006.01)

(52) U.S. Cl.
USPC .. 257/66; 257/77; 257/E21.41; 257/E29.104; 257/E21.384; 257/E29.068; 438/270; 438/137

(58) Field of Classification Search .................... 257/66, 257/77, 328, 192, 329, E21.384, E21.41, 257/E29.104, E29.068, E29.201, E29.257; 438/137, 270, 105, 212, 285
See application file for complete search history.

(56) References Cited

U.S. PATENT DOCUMENTS

| | | | |
|---|---|---|---|
| 3,439,189 | A | 4/1969 | Petry |
| 3,629,011 | A | 12/1971 | Tohi et al. |
| 3,924,024 | A | 12/1975 | Naber et al. |
| 4,160,920 | A | 7/1979 | Courier de Mere |
| 4,242,690 | A | 12/1980 | Temple |
| 4,466,172 | A | 8/1984 | Batra |
| 4,581,542 | A | 4/1986 | Steigerwald |
| 4,644,637 | A | 2/1987 | Temple |
| 4,811,065 | A | 3/1989 | Cogan |
| 4,875,083 | A | 10/1989 | Palmour |
| 4,927,772 | A | 5/1990 | Arthur et al. |
| 4,945,394 | A | 7/1990 | Palmour et al. |

(Continued)

FOREIGN PATENT DOCUMENTS

| | | |
|---|---|---|
| DE | 39 42 640 A1 | 8/1990 |
| DE | 198 09 554 | 9/1998 |

(Continued)

OTHER PUBLICATIONS

International Preliminary Report on Patentability Corresponding to International Application No. PCT/US2010/035709; Date of Mailing: Dec. 15, 2011; 8 pages.

(Continued)

*Primary Examiner* — Victor A Mandala
*Assistant Examiner* — Whitney T Moore
(74) *Attorney, Agent, or Firm* — Myers Bigel Sibley & Sajovec

(57) ABSTRACT

Semiconductor switching devices include a first wide band-gap semiconductor layer having a first conductivity type. First and second wide band-gap well regions that have a second conductivity type that is opposite the first conductivity type are provided on the first wide band-gap semiconductor layer. A non-wide band-gap semiconductor layer having the second conductivity type is provided on the first wide band-gap semiconductor layer. First and second wide band-gap source/drain regions that have the first conductivity type are provided on the first wide band-gap well region. A gate insulation layer is provided on the non-wide band-gap semiconductor layer, and a gate electrode is provided on the gate insulation layer.

49 Claims, 15 Drawing Sheets

U.S. PATENT DOCUMENTS

| | | | |
|---|---|---|---|
| 4,946,547 A | 8/1990 | Palmour et al. |
| 5,011,549 A | 4/1991 | Kong et al. |
| 5,028,977 A | 7/1991 | Kenneth et al. |
| 5,032,888 A | 7/1991 | Seki |
| 5,111,253 A | 5/1992 | Korman et al. |
| 5,155,289 A | 10/1992 | Bowles |
| 5,170,231 A | 12/1992 | Fujii et al. |
| 5,170,455 A | 12/1992 | Goossen et al. |
| 5,184,199 A | 2/1993 | Fujii et al. |
| 5,192,987 A | 3/1993 | Khan et al. |
| 5,200,022 A | 4/1993 | Kong et al. |
| 5,210,051 A | 5/1993 | Carter, Jr. |
| 5,270,554 A | 12/1993 | Palmour |
| 5,292,501 A | 3/1994 | Degenhardt et al. |
| 5,296,395 A | 3/1994 | Khan et al. |
| 5,348,895 A | 9/1994 | Smayling et al. |
| 5,371,383 A | 12/1994 | Miyata et al. |
| 5,384,270 A | 1/1995 | Ueno |
| 5,385,855 A | 1/1995 | Brown et al. |
| RE34,861 E | 2/1995 | Davis et al. |
| 5,393,993 A | 2/1995 | Edmond et al. |
| 5,393,999 A | 2/1995 | Malhi |
| 5,396,085 A | 3/1995 | Baliga |
| 5,399,887 A | 3/1995 | Weitzel et al. |
| 5,459,107 A | 10/1995 | Palmour |
| 5,468,654 A | 11/1995 | Harada |
| 5,473,176 A | 12/1995 | Kakumoto |
| 5,479,316 A | 12/1995 | Smrtic et al. |
| 5,488,236 A | 1/1996 | Baliga et al. |
| 5,506,421 A | 4/1996 | Palmour |
| 5,510,281 A | 4/1996 | Ghezzo et al. |
| 5,510,630 A | 4/1996 | Agarwal |
| 5,523,589 A | 6/1996 | Edmond et al. |
| 5,539,217 A | 7/1996 | Edmond et al. |
| 5,545,905 A | 8/1996 | Muraoka et al. |
| 5,587,870 A | 12/1996 | Anderson et al. |
| 5,629,531 A | 5/1997 | Palmour |
| 5,710,059 A | 1/1998 | Rottner |
| 5,726,463 A | 3/1998 | Brown et al. |
| 5,726,469 A | 3/1998 | Chen |
| 5,734,180 A | 3/1998 | Malhi |
| 5,739,564 A | 4/1998 | Kosa et al. |
| 5,763,905 A | 6/1998 | Harris |
| 5,776,837 A | 7/1998 | Palmour |
| 5,804,483 A | 9/1998 | Harris |
| 5,814,859 A | 9/1998 | Ghezzo et al. |
| 5,831,288 A | 11/1998 | Singh et al. |
| 5,837,572 A | 11/1998 | Gardner et al. |
| 5,851,908 A | 12/1998 | Harris et al. |
| 5,877,041 A | 3/1999 | Fuller |
| 5,877,045 A | 3/1999 | Kapoor |
| 5,885,870 A | 3/1999 | Maiti et al. |
| 5,914,500 A | 6/1999 | Bakowski et al. |
| 5,917,203 A | 6/1999 | Bhatnagar et al. |
| 5,939,763 A | 8/1999 | Hao et al. |
| 5,960,289 A | 9/1999 | Tsui et al. |
| 5,969,378 A | 10/1999 | Singh |
| 5,972,801 A | 10/1999 | Lipkin et al. |
| 5,976,936 A | 11/1999 | Miyajima et al. |
| 5,977,605 A | 11/1999 | Bakowsky et al. |
| 6,020,600 A | 2/2000 | Miyajima et al. |
| 6,025,233 A | 2/2000 | Terasawa |
| 6,025,608 A | 2/2000 | Harris et al. |
| 6,028,012 A | 2/2000 | Wang |
| 6,040,237 A | 3/2000 | Bakowski et al. |
| 6,048,766 A | 4/2000 | Gardner et al. |
| 6,054,352 A | 4/2000 | Ueno |
| 6,054,728 A | 4/2000 | Harada et al. |
| 6,063,698 A | 5/2000 | Tseng et al. |
| 6,083,814 A | 7/2000 | Nilsson |
| 6,096,607 A | 8/2000 | Ueno |
| 6,100,169 A | 8/2000 | Suvorov et al. |
| 6,104,043 A | 8/2000 | Hermansson et al. |
| 6,107,142 A | 8/2000 | Suvorov et al. |
| 6,117,735 A | 9/2000 | Ueno |
| 6,121,633 A | 9/2000 | Singh et al. |
| 6,133,587 A | 10/2000 | Takeuchi et al. |
| 6,136,727 A | 10/2000 | Ueno |
| 6,136,728 A | 10/2000 | Wang |
| 6,165,822 A | 12/2000 | Okuno et al. |
| 6,180,958 B1 | 1/2001 | Cooper, Jr. |
| 6,190,973 B1 | 2/2001 | Berg et al. |
| 6,204,135 B1 | 3/2001 | Peters et al. |
| 6,204,203 B1 | 3/2001 | Narwankar et al. |
| 6,211,035 B1 | 4/2001 | Moise et al. |
| 6,218,254 B1 | 4/2001 | Singh et al. |
| 6,218,680 B1 | 4/2001 | Carter, Jr. et al. |
| 6,221,688 B1 | 4/2001 | Fujihira et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,239,466 B1 | 5/2001 | Elasser et al. |
| 6,246,076 B1 | 6/2001 | Lipkin et al. |
| 6,297,100 B1 | 10/2001 | Kumar et al. |
| 6,297,172 B1 | 10/2001 | Kashiwagi |
| 6,303,508 B1 | 10/2001 | Alok |
| 6,316,791 B1 | 11/2001 | Schorner et al. |
| 6,316,793 B1 | 11/2001 | Sheppard et al. |
| 6,329,675 B2 | 12/2001 | Singh et al. |
| 6,344,663 B1 | 2/2002 | Slater, Jr. et al. |
| 6,365,932 B1 | 4/2002 | Kouno et al. |
| 6,388,271 B1 | 5/2002 | Mitlehner et al. |
| 6,399,996 B1 | 6/2002 | Chang et al. |
| 6,420,225 B1 | 7/2002 | Chang et al. |
| 6,429,041 B1 | 8/2002 | Ryu et al. |
| 6,448,160 B1 | 9/2002 | Chang et al. |
| 6,455,892 B1 | 9/2002 | Okuno et al. |
| 6,475,889 B1 | 11/2002 | Ring |
| 6,515,303 B2 | 2/2003 | Ring |
| 6,524,900 B2 | 2/2003 | Dahlqvist et al. |
| 6,548,333 B2 | 4/2003 | Smith |
| 6,551,865 B2 | 4/2003 | Kumar et al. |
| 6,573,534 B1 | 6/2003 | Kumar et al. |
| 6,593,620 B1 | 7/2003 | Hshieh et al. |
| 6,610,366 B2 | 8/2003 | Lipkin |
| 6,627,539 B1 | 9/2003 | Zhao et al. |
| 6,649,497 B2 | 11/2003 | Ring |
| 6,653,659 B2 | 11/2003 | Ryu et al. |
| 6,696,705 B1 | 2/2004 | Barthelmess et al. |
| 6,703,642 B1 | 3/2004 | Shah |
| 6,743,703 B2 | 6/2004 | Rodov et al. |
| 6,767,843 B2 | 7/2004 | Lipkin et al. |
| 6,861,723 B2 | 3/2005 | Willmeroth |
| 6,936,850 B2 | 8/2005 | Friedrichs et al. |
| 6,946,739 B2 | 9/2005 | Ring |
| 6,956,238 B2 | 10/2005 | Ryu et al. |
| 6,979,863 B2 | 12/2005 | Ryu |
| 7,026,650 B2 | 4/2006 | Ryu et al. |
| 7,074,643 B2 | 7/2006 | Ryu |
| 7,118,970 B2 | 10/2006 | Das et al. |
| 7,125,786 B2 | 10/2006 | Ring et al. |
| 7,183,575 B2 | 2/2007 | Shimoida et al. |
| 7,186,609 B2 | 3/2007 | Korec et al. |
| 7,221,010 B2 | 5/2007 | Ryu |
| 7,247,550 B2 | 7/2007 | Zhang |
| 7,253,031 B2 | 8/2007 | Takahashi |
| 7,279,115 B1 | 10/2007 | Sumakeris |
| 7,304,363 B1 | 12/2007 | Shah |
| 7,365,363 B2 | 4/2008 | Kojima et al. |
| 7,381,992 B2 | 6/2008 | Ryu |
| 7,528,040 B2 | 5/2009 | Das et al. |
| 7,544,963 B2 | 6/2009 | Saxler |
| 7,548,112 B2 | 6/2009 | Sheppard |
| 7,649,213 B2 | 1/2010 | Hatakeyama et al. |
| 7,687,825 B2 | 3/2010 | Zhang |
| 7,728,402 B2 | 6/2010 | Zhang et al. |
| 7,781,786 B2 | 8/2010 | Hayashi et al. |
| 2001/0055852 A1 | 12/2001 | Moise et al. |
| 2002/0030191 A1 | 3/2002 | Das et al. |
| 2002/0038891 A1 | 4/2002 | Ryu et al. |
| 2002/0047125 A1 | 4/2002 | Fukuda et al. |
| 2002/0072247 A1 | 6/2002 | Lipkin et al. |
| 2002/0102358 A1 | 8/2002 | Das et al. |
| 2002/0121641 A1 | 9/2002 | Alok et al. |
| 2002/0125482 A1 | 9/2002 | Friedrichs et al. |
| 2002/0125541 A1 | 9/2002 | Korec et al. |

| | | | |
|---|---|---|---|
| 2003/0025175 A1 | 2/2003 | Asano et al. | |
| 2003/0107041 A1 | 6/2003 | Tanimoto et al. | |
| 2003/0137010 A1 | 7/2003 | Friedrichs et al. | |
| 2003/0178672 A1 | 9/2003 | Hatakeyama et al. | |
| 2003/0201455 A1 | 10/2003 | Takahashi et al. | |
| 2004/0016929 A1 | 1/2004 | Nakatsuka et al. | |
| 2004/0079989 A1* | 4/2004 | Kaneko et al. | 257/328 |
| 2004/0082116 A1 | 4/2004 | Kub et al. | |
| 2004/0183079 A1 | 9/2004 | Kaneko et al. | |
| 2004/0211980 A1 | 10/2004 | Ryu | |
| 2004/0212011 A1 | 10/2004 | Ryu | |
| 2004/0256659 A1 | 12/2004 | Kim et al. | |
| 2004/0259339 A1 | 12/2004 | Tanabe et al. | |
| 2005/0012143 A1 | 1/2005 | Tanaka et al. | |
| 2005/0104072 A1 | 5/2005 | Slater, Jr. et al. | |
| 2005/0139936 A1 | 6/2005 | Li | |
| 2005/0151138 A1 | 7/2005 | Slater, Jr. et al. | |
| 2005/0181536 A1 | 8/2005 | Tsuji | |
| 2005/0224838 A1 | 10/2005 | Tanaka et al. | |
| 2005/0245034 A1 | 11/2005 | Fukuda et al. | |
| 2005/0275055 A1 | 12/2005 | Parthasarathy et al. | |
| 2006/0011128 A1 | 1/2006 | Ellison et al. | |
| 2006/0060884 A1 | 3/2006 | Ohyanagi et al. | |
| 2006/0086997 A1 | 4/2006 | Kanaya et al. | |
| 2006/0211210 A1 | 9/2006 | Bhat et al. | |
| 2006/0244010 A1 | 11/2006 | Saxler | |
| 2006/0255423 A1 | 11/2006 | Ryu et al. | |
| 2006/0261347 A1 | 11/2006 | Ryu et al. | |
| 2006/0261876 A1 | 11/2006 | Agarwal et al. | |
| 2006/0267021 A1 | 11/2006 | Rowland et al. | |
| 2007/0066039 A1 | 3/2007 | Agarwal et al. | |
| 2007/0120148 A1 | 5/2007 | Nogome | |
| 2007/0164321 A1 | 7/2007 | Sheppard | |
| 2007/0241427 A1 | 10/2007 | Mochizuki et al. | |
| 2008/0001158 A1 | 1/2008 | Das et al. | |
| 2008/0006848 A1 | 1/2008 | Chen et al. | |
| 2008/0029838 A1 | 2/2008 | Zhang et al. | |
| 2008/0105949 A1 | 5/2008 | Zhang et al. | |
| 2008/0121993 A1 | 5/2008 | Hefner et al. | |
| 2008/0191304 A1 | 8/2008 | Zhang et al. | |
| 2008/0230787 A1 | 9/2008 | Suzuki et al. | |
| 2008/0251793 A1 | 10/2008 | Mazzola et al. | |
| 2008/0277669 A1 | 11/2008 | Okuno et al. | |
| 2008/0296587 A1 | 12/2008 | Yamamoto et al. | |
| 2008/0296771 A1 | 12/2008 | Das et al. | |
| 2009/0085064 A1 | 4/2009 | Rueb et al. | |
| 2009/0121319 A1 | 5/2009 | Zhang et al. | |
| 2009/0146154 A1 | 6/2009 | Zhang et al. | |
| 2009/0212301 A1 | 8/2009 | Zhang et al. | |
| 2009/0267200 A1 | 10/2009 | Gutt et al. | |
| 2009/0272983 A1 | 11/2009 | Kumar et al. | |
| 2009/0289262 A1 | 11/2009 | Zhang et al. | |
| 2010/0032685 A1 | 2/2010 | Zhang et al. | |
| 2010/0133549 A1 | 6/2010 | Zhang et al. | |
| 2010/0133550 A1 | 6/2010 | Zhang et al. | |
| 2010/0140628 A1 | 6/2010 | Zhang | |
| 2010/0244047 A1 | 9/2010 | Hull et al. | |

FOREIGN PATENT DOCUMENTS

| | | |
|---|---|---|
| DE | 198 32 329 A1 | 2/1999 |
| DE | 19900171 | 7/1999 |
| DE | 10036208 A1 | 2/2002 |
| EP | 0 176 778 A2 | 4/1986 |
| EP | 0 372 412 A1 | 6/1990 |
| EP | 0 389 863 A1 | 10/1990 |
| EP | 0 615 292 A1 | 9/1994 |
| EP | 0637069 A1 | 2/1995 |
| EP | 0735591 A1 | 10/1996 |
| EP | 0837508 A2 | 4/1998 |
| EP | 0 865 085 A1 | 9/1998 |
| EP | 1 058 317 A2 | 12/2000 |
| EP | 1 361 614 A1 | 11/2003 |
| EP | 1 460 681 A2 | 9/2004 |
| EP | 1 503 425 A2 | 2/2005 |
| EP | 1 693896 A1 | 8/2006 |
| EP | 1 806 787 A1 | 7/2007 |
| EP | 1 845 561 A2 | 10/2007 |
| EP | 2 015 364 | 1/2009 |
| JP | 60-240158 | 11/1985 |
| JP | 01117363 | 5/1989 |
| JP | 03034466 | 2/1991 |
| JP | 03157974 | 7/1991 |
| JP | 3-225870 | 10/1991 |
| JP | 08264766 | 10/1996 |
| JP | 09205202 | 8/1997 |
| JP | 11191559 | 7/1999 |
| JP | 11238742 A | 8/1999 |
| JP | 11261061 A | 9/1999 |
| JP | 11266017 A | 9/1999 |
| JP | 11274487 | 10/1999 |
| JP | 2000049167 | 2/2000 |
| JP | 2000082812 A | 3/2000 |
| JP | 2000-252478 A | 9/2000 |
| JP | 02000252461 A | 9/2000 |
| JP | 2001-085704 A | 3/2001 |
| JP | 2000106371 A | 4/2001 |
| JP | 2002-314099 | 10/2002 |
| WO | WO 96/03774 | 2/1996 |
| WO | WO 97/08754 | 3/1997 |
| WO | WO 97/17730 | 5/1997 |
| WO | WO 97/39485 A1 | 10/1997 |
| WO | WO 98/02916 | 1/1998 |
| WO | WO 98/02924 A2 | 1/1998 |
| WO | WO 98/08259 | 2/1998 |
| WO | WO 98/32178 | 7/1998 |
| WO | WO 99/46809 A1 | 9/1999 |
| WO | WO99/63591 A1 | 12/1999 |
| WO | WO 00/13236 A3 | 3/2000 |
| WO | WO 01/78134 A1 | 10/2001 |
| WO | WO 2004/020706 A1 | 3/2004 |
| WO | WO 2004/079789 A2 | 9/2004 |
| WO | WO 2005/020308 A1 | 3/2005 |
| WO | WO 2006/135031 A2 | 12/2006 |
| WO | WO 2007/040710 A1 | 4/2007 |

OTHER PUBLICATIONS

International Preliminary Report on Patentability Corresponding to International Application No. PCT/US2010/035713; Date of Mailing; Dec. 15, 2011; 8 pages.

International Search Report and The Written Opinion of the International Searching Authority Corresponding to International Application No. PCT/US2011/027383; Date of Mailing: May 20, 2011; 8 Pages.

International Search Report and The Written Opinion of the International Searching Authority Corresponding to International Application No. PCT/US2011/031150; Date of Mailing: Jun. 20, 2011; 10 Pages.

European Communication Corresponding to European Application No. 07 112 298.0; Dated: Jan. 16, 2012; 7 pages.

Y. Li et al., "High Voltage (3 kV) UMOSFETs in 4H-SiC," *Transactions on Electron Devices*, vol. 49, No. 6, Jun. 2002.

"Insulated-gate bipolar transistor." *Wikipedia, the Free Encyclopedia*. Web. Jun. 21, 2010. http://en.wikipedia.org.

A.K. Agarwal, J.B. Casady, L.B. Rowland, W.F. Valek, and C.D. Brandt, "1400 V 4H-SiC Power MOSFET's," Materials Science Forum vols. 264-268, pp. 989-992, 1998.

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Materials Science Forum*, vols. 338-342, pp. 1307-1310, 2000.

A.K. Agarwal, S. Seshadri, and L.B. Rowland, "Temperature Dependence of Fowler-Nordheim Current in 6H-and 4H-SiC MOS Capacitors," *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.

Asano et al., "Dynamic Characteristics of 6.2kV High Voltage 4H-SiC pn Diode with Low Loss", Transactions of the Institute of Electrical Engineers of Japan, Part D Inst. Electr. Eng. Japan, vol. 123D, No. 5, May 2003, pp. 623-627, XP8124184.

Ayalew, T, "Dissertation of Tesfaye Ayalew", Section 4.4.3.1 MPS Diode Structure, *SiC Semiconductor Devices Technology, Modeling, and Simulation*, 2006.

Baliga "Insulated Gate Biopolar Transistor" *Power Semiconductor Devices*. PWS Publishing Company, Boston, MA. 426-502 (1996).

Baliga "Power MOSFET" *Power Semiconductor Devices*. PWS Publishing Company, Boston, MA 335-425 (1996).

Baliga, Power Semiconductor Devices, Chapter 7, PWS Publishing, 1996.

Bhatnagar et al. "Comparison of 6H-SiC, 3C-SiC, and Si for Power Devices," *IEEE Transactions on Electron Devices*, vol. 40, No. 3, Mar. 1993, pp. 645-655.

Buchner et al., "Laser Recrystallization of Polysilicon for Improved Device Quality", Springer Proceedings in Physics, vol. 35, Polycrystalline Semiconductors, pp. 289-294.

Capano, M.A., et al., Ionization Energies and Electron Mobilities in Phosphorus- and Nitrogen-Implanted 4H-Silicon Carbide, IEEE ICSCRM Conference 1999, Research Triangle Park, North Carolina (Oct. 10-13, 1999).

Chakraborty et al. "Interface Properties of $N_2O$-annealed $SiO_2/SiC$ system," *Proceedings IEEE Hong Kong Electron Devices Meeting*. Jun. 24, 2000, pp. 108-111.

Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc.* vol. 640, 2001.

Chen et al. "Theoretical Analysis of Current Crowding Effect in Metal/AlGaN/GaN Schottky Diodes and Its Reduction by Using Polysilicon in Anode,"Chin. Phys. Lett., vol. 24, No. 7 (2007) pp. 2112-2114.

Chinese Office Action dated Jan. 22, 2010, corresponding to Chinese Patent Application No. 200780029460.5, 7 pages.

Cho et al. "Improvement of charge trapping by hydrogen post-oxidation annealing in gate oxide of 4H-SiC methel-oxide-semiconductor capacitors," *Applied Physics Letters*. vol. 77, No. 8, pp. 1215-1217 (Aug. 21, 2000).

Chung et al. "Effects of anneals in ammonia on the interface trap density near athe band edges in 4H-silicon carbide metal-oxide-semiconductor capacitors," *Applied Physics Letters*. vol. 77, Nov. 27, 2000, pp. 3601-3603.

Chung et al., "The Effect of Si:C Source Ratio on $SiO_2/SiC$ Interface State Density for Nitrogen Doped 4H and 6H-SiC," *Materials Science Forum*. (2000) vols. 338-342, pp. 1097-1100.

International Search Report and Written Opinion for corresponding International Application No. PCT/US2004/004982, dated Jul. 22, 2004.

International Search Report for PCT/US01/30715.

International Search Report for PCT/US01/42414, dated Apr. 23, 2002.

International Search Report for PCT/US02/11691 dated Dec. 4, 2002.

D. Alok, E. Arnold, and R. Egloff, "Process Dependence of Inversion Layer Mobility in 4H-SiC Devices," *Materials Science Forum*, vols. 338-342, pp. 1077-1080, 2000.

Dahlquist et al. "A 2.8kV, Forward Drop JBS Diode with Low Leakage," *Materials Science Forum*, vols. 338-342, (2000) pp. 1179-1182.

Das, Mrinal K. Graduate thesis entitled, *Fundamental Studies of the Silicon Carbide MOS Structure*. Purdue University, 1999.

Dastidar, Sujoyita, A Study of P-Type Activation in Silicon Carbide, Thesis (Purdue University, May 1998).

De Meo et al., "Thermal Oxidation of SiC in $N_2O$", *J. Electrochem. Soc.*, vol. 141, 1994, pp. L150-L152.

del Prado et al. "Full Composition Range Silicon Oxynitride Films Deposited by ECR-PECVD at Room Temperatures," *Thin Solid Films*. vol. 343-344 (1999) p. 437-440.

Dimitrijev et al., "Nitridation of Silicon-Dioxide Films Grown on 6H Silicon Carbide", *IEEE Electronic Device Letters*, vol. 18, No. 5, May 5, 1997, pp. 175-177.

European Search Report for corresponding EP patent application No. 09177558.5 dated Feb. 22, 2010.

European Search Report for corresponding EP patent application No. 09163424.6 dated Apr. 9, 2010.

European Search Report; Application No. EP07120038; Jun. 16, 2008.

Extended European Search Report (12 pages) corresponding to European Application No. 07112298; Dated Feb. 18, 2009.

Fisher, C.A. et al., "The performance of high-voltage field relieved Schottky barrier diodes", IEE Proceedings, vol. 132:6, Pt. I, pp. 257-260 (Dec. 1985).

Fukuda et al. "Improvement of $SiO_2/4H$-SiC Interface Using High-Temperature Hydrogen Annealing at Low Pressure and Vacuum Annealing," *Jpn J. Appl. Phys.* vol. 38, Apr. 1999, pp. 2306-2309.

Fukuda et al. "Improvement of $SiO_2/4H$-SiC Interface by Using High Temperature Hydrogen Annealing at 1000° C.," *Extended Abstracts of the International Conference on Solid State Devices and Materials*. Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSETs Following High Temperature Anneals in Nitric Oxide," *IEEE Electron Device Letters*, vol. 22, No. 4, Apr. 2001.

H.F. Li, S. Dimitrijev, H.B. Harrison, D. Sweatman, P.T. Tanner. "Improving $SiO_2$ Grown on P-Type 4H-SiC by NO Annealing," *Materials Science Forum*. vols. 264-268 (1998) pp. 869-872.

http://www.elec.gla.ac.uk; *The Insulated Gate Bipolar Transistor (IGBT)*; Feb. 14, 2007.

Hubel, K, "Hybrid design improves diode robustness and boosts efficiency," Compoundsemiconductor.net, 2006.

Hull et al., "Drift-Free 10-kV, 20-A 4H-SiC PiN Diodes," Journal of Electronic Materials, vol. 34, No. 4, 2005, pp. 341-344.

International Preliminary Report on Patentability (9 pages) corresponding to International Application No. PCT/US2007/010192; Mailing Date: Sep. 23, 2008.

International Search Report and Written Opinion (13 pages) corresponding to International Application No. PCT/US2008/010538; Mailing Date: Dec. 22, 2008.

International Search Report and Written Opinion (14 pages) corresponding to International Application No. PCT/US2010/020071; Mailing Date: Mar. 26, 2010.

International Search Report and Written Opinion (14 pages) corresponding to International Application No. PCT/US2009/065251; Mailing Date: Jun. 1, 2010.

International Search Report and Written Opinion (16 pages) corresponding to International Application No. PCT/US2009/003089; Mailing Date: Aug. 20, 2009.

International Search Report and Written Opinion for PCT/US2007/014139; Feb. 4, 2008.

International Search Report and Written Opinion for PCT/US2010/025053 mailed on Jul. 2, 2010.

International Search Report and Written Opinion, International Application No. PCT/US2009/000734, Apr. 23, 2009.

International Search Report, PCT/US2008/008574, Sep. 26, 2008.

Invitation to Pay Additional Fees for PCT/US2007/010192; Oct. 29, 2007.

Invitation to Pay Additional Fees for PCT/US2010/025053 mailed on May 3, 2010.

J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

J.T. Richmond, S. Ryu, A.K. Agarwal and J.W. Palmour, "Hybrid 4H-SiC MOS Gated Transistor (MGT)" (admitted prior art).

Jamet, et al. "Physical properties of $N_2O$ and NO-nitrided gate oxides grown on 4H SiC," *Applied Physics Letters*. vol. 79, No. 3, Jul. 16, 2001, pp. 323-325.

K. Ueno and Tadaaki Oikawa, "Counter-Doped MOSFET's of 4H-SiC," *IEEE Electron Device Letters*, vol. 20, No. 12, pp. 624-626, Dec. 1999.

K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.

Katsunori Ueno, Tatsue Urushidani, Kouicki Hahimoto, and Yasukazu Seki. "The Guard-Ring Termination for the High-Voltage SiC Schottky Barrier Diodes". *IEEE Electron Device Letters*. vol. 16. No. 7, Jul. 1995, pp. 331-332.

Kinoshita et al., "Guard Ring Assisted RESURF: A New Termination Structure Providing Stable and High Breakdown Voltage for SiC Power Devices,"Tech. Digest of ISPSD '02, pp. 253-256.

Kobayashi et al. "Dielectric Breakdown and Current Conduction of Oxide/Nitride/Oxide Multi-Layer Structures," *1990 IEEE Symposium on VLSI Technology*. pp. 119-120.

Krishnaswami et al., "High Temperature characterization of 4H-SiC bipolar junction transistors", Materials Science Forum, Aedermannsfdorf, CH, vol. 527-529, Jan. 1, 2006, pp. 1437-1440, XP009138720, ISSN: 0255-5476.

L.A. Lipkin and J.W. Palmour, "Low interface state density oxides on p-type SiC," Materials Science Forum vols. 264-268, pp. 853-856, 1998.

Lai et al., "Interface Properties of $N_2O$-Annealed $NH_3$-Treated 6H-SiC MOS Capacitor," *Proc. 1999 IEEE Hong Kong Electron Devices Meeting*, Jun. 26, 1999, pp. 46-49.

Leonhard et al. "Long term stability of gate-oxides on n- and p-type silicon carbide studied by charge injection techniques," *Materials Science Engineering*, vol. 46, No. 1-3, Apr. 1997, pp. 263-266.

Levinshtein et al., "On the homogeneity of the turn-on process in high voltage 4H-SiC thyristors", *Solid-State Electronics*, vol. 49, No. 2, Feb. 1, 2005, pp. 233-237, XP004645018 Elsevier Science Publishers, Barking (GB) ISSN: 0038-1101.

Lipkin et al. "Insulator Investigation on SiC for Improved Reliability," *IEEE Transactions on Electron Devices*. vol. 46, No. 3, Mar. 1999, pp. 525-532.

Lipkin et al. "Challenges and State-of-the-Art Oxides in SiC," *Mat. Res. Soc. Symp. Proc.* vol. 640, 2001, pp. 27-29.

Losee et al., "Degraded Blocking Performance of 4H-SiC Rectifiers Under High dV/dt Conditions", Proceedings of 17th International Symposium on Power Semiconductor Devices & IC's, 4 pages. (May 23-26, 2005). XP010820730.

Losee et al., "High-Voltage 4H-SiC PiN Rectifiers with Single-Implant, Multi-Zone JTE Termination", Power Semiconductor Devices and ICs, 2004 Proceedings. ISPSB '04. The 16th International Symposium on Kitakyushu Int. Conf. Center, Japan May 24-27, 2004, Piscataway, NJ, USA, IEEE, May 24, 2004, pp. 301-304, XP010723398.

M. Das et al., "A 13 kV 4H-SiC N-Channel IGBT with Low Rdiff, on and Fast Switching" presented at: International Conference on Silicon Carbide and Related Materials )ICSCRM), Otsu, Japan, Oct. 14-19, 2007.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

M.A. Capano, S. Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

Ma et al. "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.

Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition. Motorola, INc., 1989, pp. 2-5-4-2-5-7.

Mutin, P. Herbert, "Control of the Composition and Structure of Silicon Oxycarbide and Oxynitride Glasses Derived from Polysiloxane Precursors," *Journal of Sol-Gel Science and Technology*. vol. 14 (1999) pp. 27-38.

Myer-Ward et al. "Turning of Basal Plane Dislocations During Epitaxial Growth on 4 off-axis 4h-SiC" 7th *European Conference on Silicon Carbide and Related Materials*, Barcelona-Spain, Sep. 7-11, 2008 retrieved from http://ecscrm08.com/invited_presentations.html , retrieved Jul. 1, 2009.

Notification of Transmittal of the International Search Report and the Written Opinion of the International Searching Authority, or the Declaration, International Search Report, Written Opinion of the International Searching Authority, PCT/US2010/026632, Date of Mailing: Oct. 8, 2010, 16 pages.

Notification of Transmittal of the International Search Report and the Written Opinion of the International Searching Authority, or the Declaration, International Search Report, Written Opinion of the International Searching Authority, PCT/US2010/035713, Date of Mailing: Jul. 27, 2010, 14 pages.

Notification of Transmittal of the International Search Report and the Written Opinion of the International Searching Authority, or the Declaration, International Search Report, Written Opinion of the International Searching Authority, PCT/US2010/042075, Date of Mailing: Sep. 24, 2010, 15 pages.

Notification of Transmittal of the International Search Report and the Written Opinion of the International Searching Authority, or the Declaration, PCT/US2010/028612, Jun. 17, 2010.

Notification of Transmittal of the International Search Report and the Written Opinion of the International Searching Authority, or the Declaration; International Search Report; Written Opinion of the International Searching Authority, PCT/US2008/004239, Mar. 2, 2009.

P.J. Tobin, Y. Okada, S. A. Ajuria, V. Lakhotia, W.A. Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811-1817.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

P.T. Lai, Supratic Chakraborty, C.L. Chan, and Y.C. Cheng, "Effects of nitridation and annealing on interface properties of thermally oxidized $SiO_2$/SiC metal-oxide-semiconductor system," *Applied Physics Letters*, vol. 76, No. 25, pp. 3744-3746, Jun. 2000.

Palmour et al. "SiC Device Technology: Remaining Issues," Diamond and Related Materials. vol. 6, 1997, pp. 1400-1404.

Palmour J: "Silicon Carbide npnp Thyristors", NASA Technical Briefs—Electronics and Computers, Dec. 1, 2000, John H. Glenn Research Center, Cleveland, Ohio (US); XP-002567723, http://www.techbriefs.com/component/content/article/7031-lew-16750?tmpl=component&print=1&page= retrieved on Feb. 10, 2010).

Panknin et al., "Electrical and microstructural properties of highly boron-implantation doped 6H-SiC", Journal of Applied Physics 89:6, pp. 3162-3167 (Mar. 15, 2001).

Pantelides et al., "Atomic-Scale Engineering of the SiC-SiO2 Interface," *Materials Science Forum*. (2000) vol. 338-342, pp. 1133-1136.

Patel, R., et al., Phosphorus-Implanted High-Voltage N.sup.+ P 4H-SiC Junction Rectifiers, Proceedings of 1998 International Symposium on Poer Semiconductor Devices & ICs, pp. 387-390 (Kyoto).

Q. Zhang et al. "12 kV 4H-SiC p-IGBTs with Record Low Specific On-Resistance" presented at: International Conference on Silicon Carbide and Related Materials (ICSCRM), Otsu, Japan, Oct. 14-19, 2007.

R. Schörner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

Ranbir Singh, Sei-Hyung Ryu and John W. Palmour, "High Temperature, High Current, 4H-SiC Accu-DMOSFET," Materials Science Forum vols. 338-342, pp. 1271-1274, 2000.

Rao et al. "Al and N Ion Implantations in 6H-SiC," Silicon Carbide and Related Materials. 1995 Conf, Kyoto, Japan. Published 1996.

Rao et al. "P-N. Junction Formation in 6H-SiC by Acceptor Implantation into N-Type Substrate," Nuclear Instruments and Methods in Physics Research B. vol. 106, 1995, pp. 333-338.

Rao et al. "Silane overpressure post-implant annealing of Al dopants in SiC: Cold wall CVD apparatus" *Applied Surface Science* 252: 3837-3842 (2006).

Rao, "Maturing ion-implantation technology and its device applications in SiC", *Solid State Electronics* 47:2, pp. 213-222, Elsevier Science Publishers (Feb. 2003).

Ryu et al. Article and Presentation: "27 m$\Omega$-cm$^2$, 1.6 kV Power DiMOSFETs in 4H-SiC," *Proceedings of the 14 International Symposium on Power Semiconductor Devices & ICs 2002*, Jun. 4-7, 2002, Santa Fe, NM.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.

S.M. Sze Semiconductor Devices, Physics and Technology. $2^{nd}$ Edition, © 2002 John Wiley and Sons, p. 130.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

Senzaki et al.; *Effects of Pyrogenic Reoxidation Annealing on Inversion Channel Mobility of 4H-SiC Metal-Oxide-Semiconductor Field-Effect Transistor Fabricated on* (1120) *Face*; Japanese Journal of Applied Physics, Japan Society of Applied Physics, Tokyo, JP; vol. 40, No. 11B, Part 2; Nov. 2001; pp. L1201-L1203.

Singh, R. and J.W. Palmour, "Planer Terminations in 4H-SiC Schottky Diodes with Low Leakage and High Yields,"IEEE International Symposium on Power Semiconductor Devices and ICs, 1997, pp. 157-160.

Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.

Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.

Streetman "Bipolar Junction Transistors" *Solid State Electronic Devices*. Prentice Hall, Englewood Cliffs, NJ. 228-284 (1980).

Sugawara et al., "3.6 kV 4H-SiC JBS Diodes with Low RonS". Materials Science Forum, vols. 338-342:2, pp. 1183-1186 (2000). XP-000944901.

Sundaresan et al., "Ultra-low resistivity Al+ implanted 4H-SiC obtained by microwave annealing and a protective graphite cap", *Solid-State Electronics* vol. 52, 2008, pp. 140-145, XP022360431.

Suzuki et al. "Effect of Post-oxidation-annealing in Hydrogen on SiO$_2$/4H-SiC Interface," *Materials Science Forum*, vols. 338-342 (2000) 1073-6.

Sze, S.M. *Physics of Semiconductor Devices*, John Wiley & Sons, p. 383-390, 1981.

Thomas et al., "Annealing of Ion Implantation Damage in SiC Using a Graphite Mask", Material Research Society Symposium Y Proceedings vol. 572, Spring 1999, pp. 45-50.

Treu et al. "A Surge Current Stable and Avalanche Rugged SiC Merged pn Schottky Diode Blocking 600V Especially Suited for PFC Applications" *Materials Science Forum* vols. 527-529: 1155-1158 (2006).

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.

V.V. Afanasev, M. Bassler, G. Pensl, and M. Schulz, "Intrinsic SiC/SiO$_2$ Interface States," *Phy. Stat. Sol.* (*a*), vol. 162, pp. 321-337, 1997.

Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.

Vassilevski et al., "Protection of selectively implanted and patterned silicon carbide surfaces with graphite capping layer during post-implantation annealing,"Institute of Physics Publishing, Semicond. Sci. Technol. 20 (2005) 271-278.

Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.

Williams et al. "Passivation of the 4H-SiC/SiO$_2$ Interface with Nitric Oxide," *Materials Science Forum*. vols. 389-393 (2002), pp. 967-972.

Xu et al. "Improved Performance and Reliability of N$_2$O-Grown Oxynitride on 6H-SiH," *IEEE Electron Device Letters*. vol. 21, No. 6, Jun. 2000, p. 298-300.

Y. Wang, C. Weitzel, and M. Bhatnagar, "Accumulation-Mode SiC Power MOSFET Design Issues," *Materials Science Forum*, vols. 338-342, pp. 1287-1290.

Yilmaz, "Optimization and Surface Charge Sensitivity of High Voltage Blocking Structures with Shallow Junctions,"IEEE Transactions on Electron Devices, vol. 38, No. 3, Jul. 1991, pp. 1666-1675.

Zhang et al., "A 10-kV Monolithic Darlington Transistor with Bforced of 336 in 4H-SiC," IEEE Electron Device Letters, vol. 30, No. 2, pp. 142-144, XP011240662.

Zhang et al.; *Design and Fabrications of High Voltage IGBTs on 4H-SiC*; 2006 IEEE Proceedings of the $18^{th}$ International Symposium on Power Semiconductor Devices & ICs, Napels, Italy Jun. 4-8, 2006, pp. 1-4.

Notification Concerning Transmittal of International Preliminary Report on Patentability corresponding to International Application No. PCT/US2011/031150; Date of Mailing: Oct. 26, 2012; 8 Pages.

Torvik et al., Electrical characterization of GaN/SiC n-p heterojunction diodes, *Appl. Phys. Lett.* 72, (1998), pp. 1371-1373.

International Preliminary Report on Patentability Corresponding to International Application No. PCT/US2011/027383; Date of Mailing: Sep. 20, 2012; 7 Pages.

\* cited by examiner

WIDE BAND-GAP MOSFETS HAVING A HETEROJUNCTION UNDER GATE TRENCHES THEREOF AND RELATED METHODS OF FORMING SUCH DEVICES

FIELD OF THE INVENTION

The present invention relates to semiconductor devices and, more particularly, to wide band-gap Metal Oxide Semiconductor Field Effect Transistors ("MOSFET") and devices that include such transistors.

BACKGROUND

Power MOSFETs are a well known type of semiconductor transistor that may be used as a switching device in high power applications. Power MOSFETs are three terminal devices that include a source region and a drain region that are separated by a channel, and a gate electrode that is disposed adjacent the channel. A power MOSFET may be turned on or off by applying a gate bias voltage to the gate electrode. When a power MOSFET is turned on (i.e., it is in its "on-state"), current is conducted through the channel of the MOSFET between the source region and the drain region. When the bias voltage is removed from the gate electrode (or reduced below a threshold level), the current ceases to conduct through the channel. By way of example, an n-type MOSFET has n-type source and drain regions and a p-type channel. An n-type MOSFET turns on when a gate bias voltage is applied to the gate electrode that is sufficient to create a conductive n-type inversion layer in the p-type channel region that electrically connects the n-type source and drain regions, thereby allowing for majority carrier conduction therebetween.

The gate electrode of a power MOSFET is separated from the channel region by a thin oxide or other gate insulating layer. Because the gate of the MOSFET is only capacitively coupled to the channel region through the gate insulating layer, minimal gate current is required to maintain the MOSFET in its on-state or to switch the MOSFET between its on-state and its off-state. Thus, only minimal charging and discharging current is required during switching, allowing for less complex gate drive circuitry. Moreover, because MOSFETS are unipolar devices in which current conduction occurs solely through majority carrier transport, MOSFETs may exhibit very high switching speeds. The drift region of a power MOSFET, however, may exhibit a relatively high on-resistance, which arises from the absence of minority carrier injection. This increased resistance can limit the forward current density achievable with power MOSFETs. Additionally, the gate insulating layer of MOSFETs may degrade over time with use of the MOSFET, which can result in device failure and/or limit the rated operating characteristics (e.g., blocking voltage) of the MOSFET to levels that will not cause excessive degradation of the gate insulating layer.

Many power semiconductor devices are formed of silicon ("Si"), although a variety of other semiconductor materials have also been used. In particular, in high power applications, a variety of wide band-gap semiconductors have been used (herein, the term "wide band-gap semiconductor" encompasses any semiconductor having a band-gap of at least 1.4 eV) due, for example, to their high electric field breakdown strength. One such wide band-gap semiconductor is silicon carbide ("SiC"), which has a number of potentially advantageous semiconductor characteristics including, for example, a high electric field breakdown strength, high thermal conductivity, high electron mobility, high melting point and high-saturated electron drift velocity. Thus, relative to devices formed in other semiconductor materials such as, for example, silicon, electronic devices formed in silicon carbide may have the capability of operating at higher temperatures, at high power densities, at higher speeds, at higher power levels and/or under high radiation densities. Silicon carbide MOSFETs have been used as switching devices in a variety of power applications because of their ability to handle relatively large output currents and support relatively high blocking voltages.

For example, silicon carbide power double-implanted MOSFETS ("DMOSFETS") may exhibit superior performance as compared to silicon-based MOSFETs in a number of high power switching applications. However, mass production of silicon carbide DMOSFETS may be unduly expensive because of, for example, the number of ion implantation steps. Moreover, the production process is complicated by the large number of photolithography processes that may be required, and this complexity can negatively impact overall device yields. Moreover, the channel mobility of silicon carbide power DMOSFETs may be relatively low, and thus larger chip sizes are typically required. These considerations have limited the use of silicon carbide DMOSFETs in commercial applications.

In DMOSFET devices, the channel region is located under the gate electrode, and hence current flow through the channel is in a horizontal direction (i.e., the channel defines a plane that is generally parallel to the substrate). As a result, the current only flows through a relatively small area, and hence the resistance of the channel may be relatively high. Silicon carbide MOSFETs having a trench gate structure are also known in the art. In these devices, the source is located at the top of the device and the drain is located at the bottom of the device, and hence the current flows through the device in a vertical direction (i.e., the channel defines a plane that is generally normal to the substrate). Typically, these devices have two source connections (one on either side of the gate electrode), and the channel current through these devices flows through a much larger area. This reduces the "on-resistance" of the device, which allows the device to handle much higher powers as compared to conventional MOSFETs. One specific type of MOSFET having a trench gate structure is the UMOSFET, which refers to a vertical MOSFET having a trench that generally resembles a "U" shape. UMOSFETs may operate at higher speeds and/or exhibit a lower on-resistance as compared to conventional MOSFETs.

SUMMARY

Pursuant to embodiments of the present invention, semiconductor switching devices are provided that include a first wide band-gap semiconductor layer having a first conductivity type. First and second wide band-gap well regions that have a second conductivity type that is opposite the first conductivity type are provided on the first wide band-gap semiconductor layer. A non-wide band-gap semiconductor layer having the second conductivity type is provided on the first wide band-gap semiconductor layer. First and second wide band-gap source/drain regions that have the first conductivity type are provided on the first wide band-gap well region. A gate insulation layer is provided on the non-wide band-gap semiconductor layer, and a gate electrode is provided on the gate insulation layer.

In some embodiments, the non-wide band-gap semiconductor layer is directly on the first wide band-gap semiconductor layer so as to form a heterojunction with the first wide band-gap semiconductor layer. The first wide band-gap semiconductor layer may be a wide band-gap drift layer. A wide band-gap current spreading layer may be provided on the first wide band-gap semiconductor layer and, in such embodiments, the non-wide band-gap semiconductor layer may be directly on the wide band-gap current spreading layer. The non-wide band-gap semiconductor layer may be a silicon layer.

In some embodiments, the first wide band-gap semiconductor layer may be an n-type silicon carbide drift layer, the first and second wide band-gap well regions may be first and second p-type silicon carbide well regions, the first and second wide band-gap source/drain regions may be first and second n-type silicon carbide source/drain regions, and the non-wide band-gap semiconductor layer may be a p-type silicon layer. The device may also include a silicon carbide substrate on the n-type silicon carbide drift layer opposite the first and second p-type silicon carbide well regions. The gate insulation layer may be on a top surface of the non-wide band-gap semiconductor layer, and the gate electrode may be on a top surface of the gate insulation layer. In some embodiments, the silicon carbide substrate may be an n-type silicon carbide substrate, and the semiconductor switching device may be a silicon carbide power MOSFET. In other embodiments, the silicon carbide substrate may be a p-type silicon carbide substrate, and the semiconductor switching device may be a silicon carbide insulated gate bipolar junction transistor ("IGBT").

In some embodiments, the semiconductor switching device may further include a second wide band-gap semiconductor region having the second conductivity type between the first wide band-gap semiconductor layer and the non-wide band-gap semiconductor layer. In such embodiments, the second wide band-gap semiconductor region having the second conductivity type and the non-wide band-gap semiconductor layer may faun a heterojunction. The device may further include an electrical connection between the non-wide band-gap semiconductor layer and the first and second wide band-gap source/drain regions. The heterojunction may have a first built-in potential that is lower than a second built-in potential of a homojunction formed between the first wide band-gap semiconductor layer and the first wide band-gap well region.

In some embodiments, a top surface of the non-wide band-gap semiconductor layer may be closer to a bottom surface of the first wide band-gap semiconductor layer than are bottom surfaces of the first and second wide band-gap well regions. The non-wide band-gap semiconductor layer may be between the first and second wide band-gap well regions in some embodiments. The gate insulation layer may be between the non-wide band-gap semiconductor layer and the first wide band-gap well region and between the non-wide band-gap semiconductor layer and the second wide band-gap well region, and the gate electrode may be disposed within a first recess in a first portion of the gate insulation layer that is between the non-wide band-gap semiconductor layer and the first wide band-gap well region and within a second recess in a second portion of the gate insulation layer that is between the non-wide band-gap semiconductor layer and the second wide band-gap well region.

Pursuant to further embodiments of the present invention, methods of forming semiconductor devices are provided in which a first wide band-gap semiconductor layer having a first conductivity type is provided on a substrate. A second wide band-gap semiconductor layer having a second conductivity type that is opposite the first conductivity type is provided on the first wide band-gap semiconductor layer. A gate trench is provided that penetrates the second wide band-gap semiconductor layer and a portion of the first wide band-gap semiconductor layer. The gate trench divides the second wide band-gap semiconductor layer into a first wide band-gap well region and a second wide band-gap well region. First and second wide band-gap source/drain regions that each have the first conductivity type are provided on the first wide band-gap well region. A non-wide band-gap semiconductor layer having the second conductivity type is provided in the gate trench and on the first wide band-gap semiconductor layer. The non-wide band-gap semiconductor layer may be a silicon layer.

In some embodiments, providing the first and second wide band-gap source/drain regions may comprise forming a third wide band-gap semiconductor layer region having the first conductivity type on the second wide band-gap semiconductor layer, and dividing the third wide band-gap semiconductor layer region into the first and second wide band-gap source/drain regions by the formation of the gate trench. In other embodiments, providing the first and second wide band-gap source/drain regions may comprise implanting ions having the first conductivity type into first and second upper portions of the second wide band-gap semiconductor layer.

In some embodiments, the method may further involve providing a gate insulation layer on sidewalls of the gate trench and on the non-wide band-gap semiconductor layer, and providing a gate electrode on the gate insulation layer. In some embodiments, the non-wide band-gap semiconductor layer may be provided directly on the first wide band-gap semiconductor layer so as to form a heterojunction with the first wide band-gap semiconductor layer. The first wide band-gap semiconductor layer may be an n-type silicon carbide drift layer or an n-type current spreading layer, the first and second wide band-gap well regions may be first and second p-type silicon carbide well regions, the first and second wide band-gap source/drain regions may be first and second n-type silicon carbide source/drain regions, and the silicon layer may be a p-type silicon layer.

In some embodiments, the substrate may be an n-type silicon carbide substrate, and the semiconductor switching device comprises a silicon carbide power MOSFET. In other embodiments, the substrate may be a p-type silicon carbide substrate, and the semiconductor switching device comprises a power silicon carbide insulated gate bipolar junction transistor ("IGBT"). The method may further involve providing a third wide band-gap semiconductor region having the second conductivity type on the first wide band-gap semiconductor layer prior to providing the non-wide band-gap semiconductor layer. In such embodiments, the non-wide band-gap semiconductor layer may be on the third wide band-gap semiconductor region, and the third wide band-gap semiconductor region and the non-wide band-gap semiconductor layer form a heterojunction. The method may also include providing an electrical connection between the non-wide band-gap semiconductor layer and the first and second wide band-gap source/drain regions.

Pursuant to further embodiments of the present invention, semiconductor devices are provided that include a first wide band-gap semiconductor layer and a gate insulation layer on the first wide band-gap semiconductor layer. A gate electrode is provided adjacent the gate insulation layer. A non-wide band-gap semiconductor pattern is provided between the first wide band-gap semiconductor layer and at least a portion of the gate insulation layer.

In some embodiments, the non-wide band-gap semiconductor pattern is directly on the first wide band-gap semiconductor layer so as to form a heterojunction with the first wide band-gap semiconductor layer. In some embodiments, the gate electrode may be at least partially positioned within a gate trench so that a bottom portion of the gate electrode is positioned in a bottom portion of the gate trench, and the non-wide band-gap semiconductor pattern may be positioned between the bottom portion of the gate electrode and the first wide band-gap semiconductor layer. In other embodiments, the gate electrode may include opposed sidewalls, and at least a portion of the non-wide band-gap semiconductor pattern may be between the opposed sidewalls of the gate electrode.

In some embodiments, the first wide band-gap semiconductor layer may have a first conductivity type, and the non-wide band-gap semiconductor pattern may have a second conductivity type that is different from the first conductivity type. In these embodiments, the device may further include a wide band-gap semiconductor pattern having the second conductivity type between at least a portion of the first wide band-gap semiconductor layer and the non-wide band-gap semiconductor pattern. The semiconductor device may also include first and second wide band-gap semiconductor well regions having the second conductivity type on the first wide band-gap semiconductor layer and first and second wide band-gap semiconductor source/drain regions having the first conductivity type on the respective first and second wide band-gap semiconductor well regions.

In some embodiments, the semiconductor device may also include an electrical connection between the non-wide band-gap semiconductor pattern and the first and second wide band-gap semiconductor source/drain regions. In some embodiments, the non-wide band-gap semiconductor pattern is a silicon pattern, and the first wide band-gap semiconductor layer is a silicon carbide layer.

DETAILED DESCRIPTION

Figure 1:
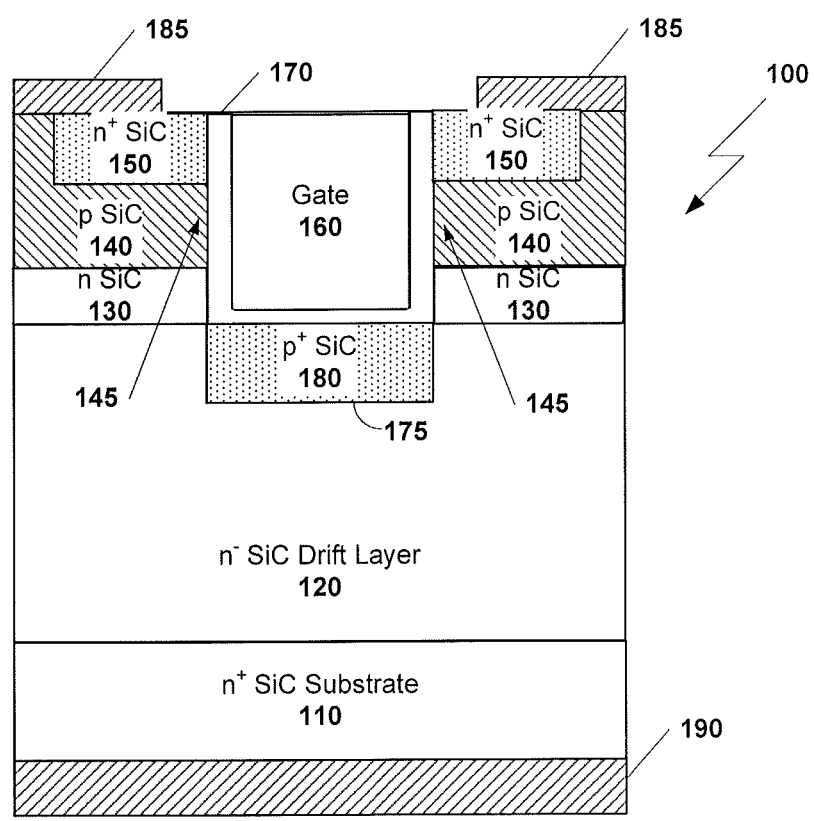
FIG. 1 is a schematic cross-sectional diagram of a silicon carbide power UMOSFET.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this disclosure and the relevant art and will not be interpreted in an idealized or overly formal sense unless expressly so defined herein.

It will be understood that the embodiments disclosed herein can be combined. Thus, features that are pictured and/or described with respect to a first embodiment may likewise be included in a second embodiment, and vice versa.

Power silicon carbide MOSFETs are in use today for applications requiring high voltage blocking such as voltage blocking of 5,000 volts or more. By way of example, silicon carbide MOSFETs are commercially available that are rated for current densities of 10 A/cm$^2$ or more that will block voltages of at least 10 kV. To form such devices, a plurality of "unit cells" are typically formed, where each unit cell typically comprises a MOSFET that has a gate electrode, two source regions (one at either side of the gate electrode) and a drain region. In high power applications, a large number of these unit cells are typically provided on a single semiconductor substrate, and a common gate electrode is typically formed on a top side of the semiconductor substrate that acts as the gate electrode for all of the unit cells. The opposite (bottom) side of the semiconductor substrate acts as a common drain for all of the units cells of the device. A plurality of source regions are interposed within openings in the gate electrode. These source regions are also electrically connected to each other to serve as a common source. It will be appreciated that the above description is of an n-type MOSFET; the locations of the drain and source would be reversed for a p-type MOSFET.

Herein, embodiments of the present invention are described with respect to cross-sectional diagrams that show a single unit cell of a power MOSFET. It will be appreciated that actual implementations will typically include a large number of unit cells. However, it will also be appreciated that the present invention is not limited to such devices, and that the claims appended hereto also cover MOSFETs and other power switching devices that comprise, for example, a single unit cell. Moreover, while the present disclosure focuses on silicon carbide devices, it will be appreciated that embodiments of the present invention may also have applicability to devices formed using other wide band-gap semiconductors such as, for example, gallium nitride, zinc selenide or any other II-VI or III-V wide band-gap compound semiconductors.

FIG. 1 is a schematic cross-sectional diagram of an n-channel silicon carbide power UMOSFET 100. As shown in FIG. 1, the UMOSFET 100 may be implemented on a heavily-doped (n$^+$) single crystal n-type silicon carbide substrate 110. A lightly-doped (n$^-$)n-type silicon carbide drift layer 120 is provided on the substrate 110. A moderately-doped (n) n-type silicon carbide current spreading layer 130 is provided on the n$^-$ silicon carbide drift layer 120. The current spreading layer 130 may be split into two portions by the gate structure, as is described below. The drift layer 120 and the current spreading layer 130 may be formed, for example, by epitaxial growth on the substrate 110.

The lightly-doped (n$^-$) drift layer 120 may have a doping concentration of, for example, about $8.5 \times 10^{14}$ dopants per cubic cm, and may be about 50 microns thick (in the vertical direction in FIG. 1). The moderately-doped n-type current spreading layer 130 may have a doping concentration of, for example, about $2.1 \times 10^{17}$ dopants per cubic cm, and may be about 0.4 microns thick. First and second spaced apart p-type silicon carbide wells 140 ("p-wells") are provided on an upper surface of the n-type current spreading layer 140. The p-wells 140 may be epitaxially grown or formed by an ion implantation process. Each p-well 140 may be moderately doped p-type to, for example, a dopant concentration of about $2 \times 10^{17}$ dopants per cubic cm, and each p-well 140 may be about 1 micron thick. First and second heavily-doped (n$^+$) n-type silicon carbide source regions 150 are provided within upper portions of the respective p-wells 140. Each heavily-doped region 150 may have a dopant concentration of about $6.5 \times 10^{18}$ dopants per cubic cm, and each source region 150 may be about 0.5 microns thick.

The heavily-doped (n$^+$) n-type silicon carbide regions 150 act as the source of the MOSFET 100, while the current spreading layer 130, the drift layer 120 and the substrate 110 act as a common drain region for the MOSFET 100. Channel regions 145 are provided in each p-well 130 between the source region 150 and the current spreading layer 130.

A gate insulating layer 170 that may have, for example, a generally U-shape is formed on the drift layer 120 between the two portions of the current spreading layer 130 and the two p-wells 140. The gate insulating layer 170 may comprise, for example, a thin silicon dioxide layer. A gate electrode 160 is provided on the gate insulating layer 170. The gate electrode 160 may comprise, for example, a doped polysilicon or silicon carbide layer, and it may fill the interior of the U-shaped gate insulating layer 170. The gate insulating layer 170 and the gate electrode 160 together comprise a gate trench structure 175. A heavily-doped (p$^+$) p-type silicon carbide region 180 is provided beneath the gate electrode 160 underneath the gate trench structure 175. The heavily-doped (p$^+$) p-type silicon carbide region 180 may be formed by ion implantation, and is electrically connected to the source regions 150 by an electrical connection (not shown in FIG. 1). The p-type region 180 may also be considered to be part of the gate trench structure 175.

An ohmic contact 185 (e.g., a metal layer) is provided on the n$^+$ source regions 150 and on an upper portion of the p-wells 140. The contacts 185 may be electrically connected to each other and may act as a common source contact for the MOSFET 100. An ohmic contact 190 on the back side of the n$^+$ silicon carbide substrate 110 acts as the drain contact for the MOSFET 100.

UMOSFETs such as MOSFET 100 may typically be fabricated with fewer photolithographic and ion implantation steps as compared to DMOSFETs, and hence may be less expensive to manufacture and/or may exhibit higher device yields. Additionally, the channel mobility of UMOSFETs may be as much as five or more times greater than the channel mobility of a similar DMOSFET due to the lower on-state resistance provided by the vertical structure of the UMOSFET. UMOSFETs may also have higher channel densities than comparable DMOSFETs. Unfortunately, the p-type region 180 underneath the gate trench may increase the JFET resistance of the device, and increases the depth of the trench structure 175. The increased JFET resistance in the p-type region 180, which may in some cases be greater than 10 kΩ/□, may negatively impact the switching speed of the MOSFET. Moreover, power UMOSFETs may suffer from electrical field crowding at the corners of the insulating layer 170 at the bottom of the trench structure 175. This electrical field crowding can damage the gate insulation layer 170 and/or decrease manufacturing yields.

Electron mobilities in the inversion layer in the channels 145 of greater than 150 cm$^2$/Vs have been demonstrated in UMOSFET devices formed on (112$^-$0) face (A-face) of 4H silicon carbide, which is much higher than the electron channel mobilities that are currently achievable on the Si face of 4H silicon carbide. However, A-face 4H silicon carbide is typically not preferred in vertical power devices due to the lower critical field of this material in the (0001) direction.

Pursuant to embodiments of the present invention, power switching devices that include MOSFETs are provided such as, for example, power MOSFET switches, power insulated gate bipolar junction transistors ("IGBTs") and power MOS-controlled thyristors (MCTs) that are have a novel UMOSFET structure. In this structure, the corners of the MOS trench structure are protected by a semiconductor material that has a lower sheet resistance (e.g., silicon) than an underlying wide band-gap (e.g., silicon carbide) semiconductor drift layer. The silicon and the underlying silicon carbide form a heterojunction. In an n-channel device, the silicon may be heavily doped (p$^+$) p-type silicon, while in a p-channel device, the silicon may be heavily doped (n$^+$) n-type silicon. The silicon region may be electrically connected to the source regions of an n-channel UMOSFET, and to the drain regions of a p-channel UMOSFET.

Due to the low sheet resistance of the heavily doped p-type silicon material (which may have a resistance of, for example, less than 60Ω/□, the UMOSFETs according to embodiments of the present invention may exhibit very fast switching speeds. Moreover, the JFET resistance due to the introduction of the heterojunction may be minimal since the built-in potential of such a junction is only about 1.5 volts, which is significantly less than the built-in potential of a silicon carbide homojunction, which exceeds 2.7 volts. Additionally, the heavily-doped p-type silicon region can be formed and doped during growth of the device, and hence does not significantly impact the cost of manufacturing the device.

The power MOSFET based devices according to embodiments of the present invention may exhibit a number of advantages as compared to conventional devices. For example, when the devices according to embodiments of the present invention are in their reverse-biased or "off-states," the silicon/silicon carbide heterojunction expands the depletion region, thereby shielding the electrical field from the corners of the trench structure. The resulting lower electric field levels in the gate oxide layer reduces the stress experienced by the gate oxide layer as compared to conventional UMOSFETs, and thus may have improved device stability. As the gate oxide may undergo less stress during device operation, the standard for qualifying a device may also be lowered, which may result in improved device manufacturing yields.

Figure 2A:
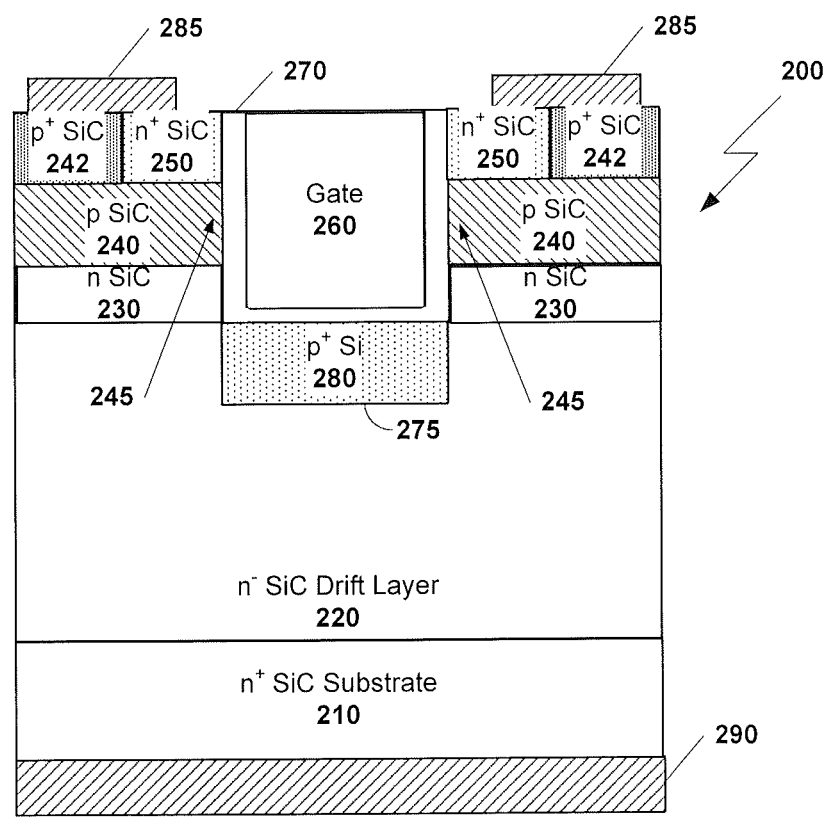
FIG. 2A is a schematic cross-sectional diagram of a silicon carbide power UMOSFET according to embodiments of the present invention.

FIG. 2A is a schematic cross-sectional diagram of a power MOSFET 200 according to certain embodiments of the present invention. The MOSFET 200 may be implemented as a monolithic device on, for example, a heavily-doped bulk single crystal n-type silicon carbide substrate 210. It will be appreciated, however, that, in some embodiments, the substrate 210 may be removed after the device is formed, or may be omitted altogether. It will also be appreciated that herein the term "substrate" may encompass a semiconductor layer such as, for example, a semiconductor layer that is epitaxially grown or otherwise formed on a semiconductor or non-semiconductor substrate.

A lightly-doped (n$^-$) silicon carbide drift layer 220 is provided on the substrate 210. The drift layer 220 may be formed, for example, by epitaxial growth on the substrate 210. A moderately-doped (n) n-type silicon carbide current spreading layer 230 is provided on the n$^-$ silicon carbide drift layer 220. The current spreading layer 230 may be split into two portions by the gate structure (the gate structure is described below). First and second spaced apart p-type silicon carbide wells 240 ("p-wells") are provided on an upper surface of the n-type silicon carbide current spreading layer 230. The p-wells 240 may be epitaxially grown or formed by an ion implantation process. First and second heavily-doped (n$^+$) n-type silicon carbide regions 250 are provided within upper portions of the respective p-wells 240. Additionally, upper portions 242 of each p-well 240 that are adjacent the respective first and second heavily-doped (n$^+$) n-type silicon carbide regions 250 are heavily-doped (p$^+$) p-type.

A generally U-shaped gate insulating layer 270 (e.g., a silicon dioxide layer) is formed on the drift layer 220 between the p-wells 240. A gate electrode 260 (e.g., a doped polysilicon or silicon carbide layer) is provided on the gate insulating layer 270. The gate electrode 260 may fill the interior of the U-shaped gate insulating layer 270. The gate insulating layer 270 and the gate electrode 260 together comprise a gate trench structure 275. A heavily-doped (p$^+$) p-type silicon region 280 is provided beneath the gate electrode 260 underneath the bottom portion of the gate insulating layer 270. The heavily-doped (p$^+$) p-type silicon region 280 is electrically connected to the regions 250 by an electrical connection (not shown in FIG. 2A). The heavily-doped (p$^+$) p-type silicon region 280 forms a heterojunction with the underlying n$^-$ silicon carbide drift layer 220. The p-type region 280 may also be considered to be part of the gate trench structure 275.

The heavily-doped (n$^+$) n-type silicon carbide regions 250 act as the source of the MOSFET 200, while the drift layer 220 acts as a common drain region for the MOSFET 200. Channel regions 245 are provided in each p-well 240 between the source region 250 and the current spreading layer 230. An ohmic contact 285 (e.g., a metal layer) is provided on the n$^+$ source regions 250 and on the upper portions of the p-wells 240. The contacts 285 may be electrically connected to each other and may act as a common source contact for the MOSFET 200. An ohmic contact 290 on the back side of the n$^+$ silicon carbide substrate 210 acts as the drain contact for the MOSFET 200.

The current spreading layer 230 acts to spread out the current flowing through the p-wells 240. If the current spreading layer 230 is not provided, it may be necessary to significantly increase the vertical spacing between the top surface of the heavily-doped p-type silicon layer 280 and the bottom surface of the p-wells 240. The degree of separation necessary is a function of (1) the built-in potentials between the p-wells 240 and drift layer 220 (or the current spreading layer 230) and (2) the built-in potentials between the heavily-doped region 280 at the bottom of the trench structure and the drift layer 220. When the heavily-doped region comprises a silicon carbide layer as is in the case of the MOSFET 100 of FIG. 1, the vertical spacing between the top surface of the heavily-doped region 180 and the bottom surface of the p-wells 140 may need to be on the order of 5 microns or more for various applications, resulting in a significantly taller device structure, that is more expensive to manufacture. In contrast, when the heavily-doped region at the bottom of the trench structure comprises a silicon layer that forms heterojunction with the drift layer 220 as is in the case of the MOSFET 200 of FIG. 2A, the built in potential of the second junction may be reduced from greater than 2.5 volts in the case of the device 100 of FIG. 1 to approximately 1.5 volts for the device of FIG. 2A. As a result, the vertical spacing between the top surface of the heavily-doped silicon region 280 and the bottom surface of the p-wells 240 in the MOSFET 200 of FIG. 2A may need to only be on the order of perhaps 3 microns.

The $p^+$ and $n^+$ conductivity type regions and epitaxial layers described above may be as heavily doped as possible without causing excessive fabrication defects. Suitable dopants for producing the p-type silicon carbide regions include aluminum, boron or gallium. Suitable dopants for producing the n-type silicon carbide regions include nitrogen and phosphorus.

Figure 2B:
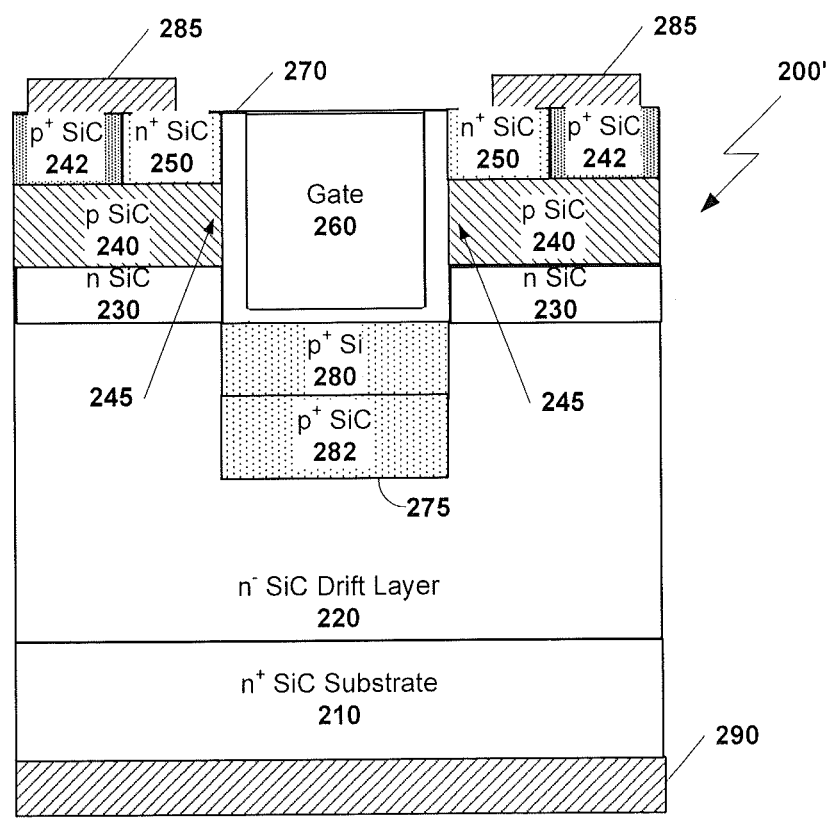
FIG. 2B is a schematic cross-sectional diagram of a modified version of the silicon carbide power UMOSFET of FIG. 2A.

FIG. 2B is a schematic cross-sectional diagram of a power MOSFET 200' according to further embodiments of the present invention. The MOSFET 200' may be identical to the MOSFET 200 of FIG. 2A, except that it further includes an implanted p-type silicon carbide region 282 between the heavily-doped ($p^+$) p-type silicon region 280 and the $n^-$ silicon carbide drift layer 220. In the MOSFET of FIG. 2A, the p-type silicon layer may form a Schottky contact to the $n^-$ silicon carbide drift layer 220. Such Schottky contacts may exhibit increased leakage currents. By providing the implanted p-type silicon carbide region 282 underneath the heavily-doped ($p^+$) p-type silicon region 280 as is done in the power MOSFET 200' of FIG. 2B, the p-n junction formed between the p-type silicon carbide layer 282 and the n-type silicon carbide layer 220 may comprise an ohmic contact, and hence may exhibit reduced leakage currents. This may be advantageous, for example, in devices that are designed for high temperature applications where leakage current problems may be exacerbated.

Figure 3A:
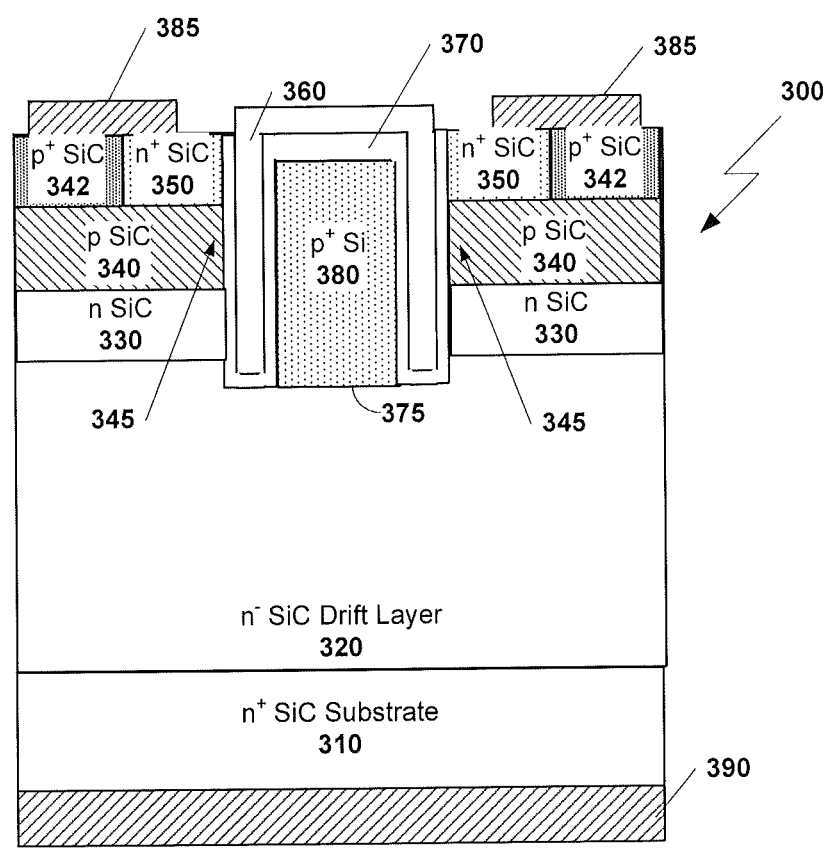
FIG. 3A is a schematic cross-sectional diagram of a silicon carbide power UMOSFET according to further embodiments of the present invention.

FIG. 3A is a schematic cross-sectional diagram of a power MOSFET 300 according to further embodiments of the present invention. The MOSFET 300 may be implemented as a monolithic device on, for example, a heavily-doped bulk single crystal n-type silicon carbide substrate 310. It will be appreciated, however, that, in some embodiments, the substrate 310 may be removed after the device is formed, or may be omitted altogether.

A lightly-doped ($n^-$) silicon carbide drift layer 320 is provided on the substrate 310. The drift layer 320 may be formed, for example, by epitaxial growth on the substrate 310. A moderately-doped n-type silicon carbide current spreading layer 330 is provided on the $n^-$ silicon carbide drift layer 320. The current spreading layer 330 may be split into two portions by the gate structure, as is described below. First and second spaced apart p-type silicon carbide wells 340 ("p-wells") are provided on an upper surface of the moderately-doped n-type silicon carbide current spreading layer 330. The p-wells 340 may be epitaxially grown or formed by an ion implantation process, and may be moderately-doped. First and second heavily-doped ($n^+$) n-type silicon carbide source regions 350 are provided within upper portions of the respective p-wells 340. Additionally, upper portions 342 of each p-well 340 that are adjacent the respective first and second heavily-doped ($n^+$) n-type silicon carbide source regions 350 are heavily-doped p-type. Channel regions 345 are provided in each p-well 340 between the source region 350 and the current spreading layer 330.

A gate insulating layer 370 (e.g., a silicon dioxide layer) is formed on the drift layer 320 between the p-wells 340. As shown in FIG. 3A, the gate insulating layer 370 may have an upside down "U" shape, with a pair of recesses provided that each start at the bottom of the "U" shape (i.e., the top of the layer 370 in the orientation of FIG. 3A) and run most of the way through the legs of the upside down "U" shape. A gate electrode 360 (e.g., a doped polysilicon or silicon carbide layer) is formed in each of the recesses in the upside down "U" shaped gate insulating layer 370 and on an upper surface of the gate insulating layer 370. In this manner, the gate electrode is provided adjacent each of the channel regions 345 in the respective p-wells 340. The gate insulating layer 370 and the gate electrode 360 together comprise a gate trench structure 375.

A heavily-doped ($p^+$) p-type silicon region 380 is provided in the interior of the upside down "U" shaped gate insulating layer 370. This heavily-doped ($p^+$) p-type silicon region 380 is electrically connected to the source regions 350 by an electrical connection (not shown in FIG. 3A). The heavily-doped ($p^+$) p-type silicon region 380 forms a heterojunction with the underlying $n^-$ silicon carbide drift layer 320.

The heavily-doped ($n^+$) n-type silicon carbide source regions 350 act as the source of the MOSFET 300, while the drift layer 320 acts as a common drain region for the MOSFET 300. An ohmic contact 385 (e.g., a metal layer) is provided on the $n^+$ source regions 350 and on the $p^+$ regions 342. The contacts 385 may be electrically connected to each other and may act as a common source contact for the MOSFET 300. An ohmic contact 390 on the back side of the $n^+$ silicon carbide substrate 310 acts as the drain contact for the MOSFET 300.

The $p^+$ and $n^+$ conductivity type regions and epitaxial layers described above may be as heavily doped as possible without causing excessive fabrication defects. Suitable dopants for producing the p-type silicon carbide regions include aluminum, boron or gallium. Suitable dopants for producing the n-type silicon carbide regions include nitrogen and phosphorus.

Figure 3B:
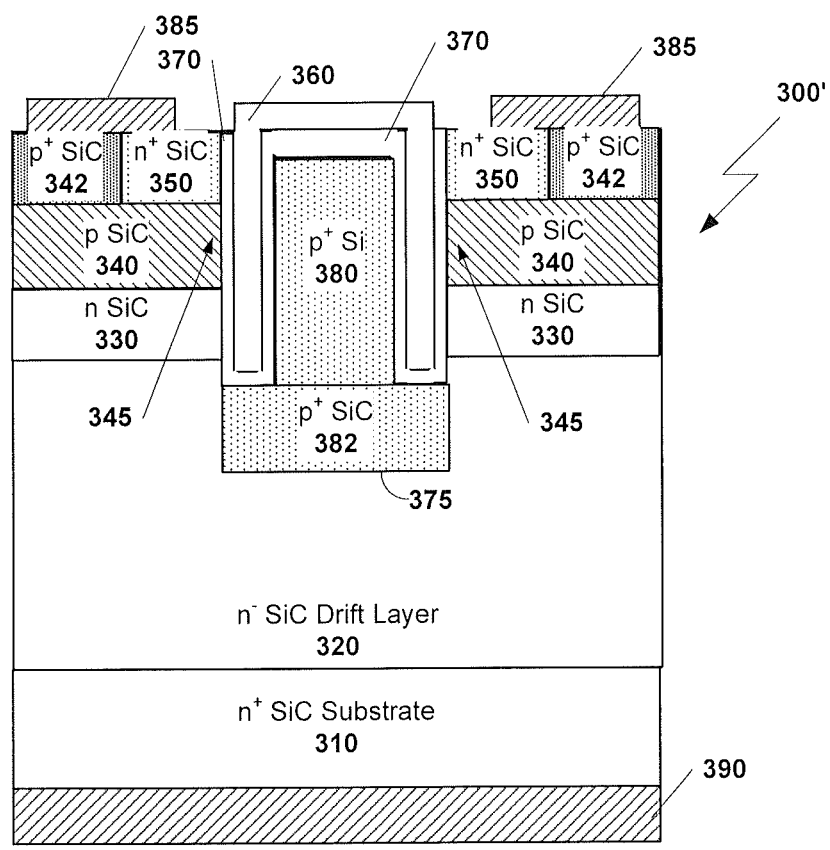
FIG. 3B is a schematic cross-sectional diagram of a modified version of the silicon carbide power UMOSFET of FIG. 3A.

FIG. 3B is a schematic cross-sectional diagram of a power MOSFET 300' according to further embodiments of the present invention. The MOSFET 300' may be identical to the MOSFET 300 of FIG. 3A, except that it further includes an implanted p-type silicon carbide region 382 between the heavily-doped ($p^+$) p-type silicon region 380 and the $n^-$ silicon carbide drift layer 320. In the MOSFET of FIG. 3A, the p-type silicon layer forms a Schottky contact to the $n^-$ silicon carbide drift layer 320. Such Schottky contacts may exhibit increased leakage currents. By providing the implanted p-type silicon carbide region 382 underneath the heavily-doped ($p^+$) p-type silicon region 380 as is done in the power MOSFET 300' of FIG. 3B, the p-n junction formed between the p-type silicon carbide layer 382 and the n-type silicon carbide layer 320 may comprise an ohmic contact, and hence may exhibit reduced leakage currents.

While FIGS. 2A, 2B, 3A and 3B each illustrate the structure of a unit cell of an n-channel MOSFET, it will be appreciated that pursuant to further embodiments of the present invention, the polarity of each of the semiconductor layers in each device could be reversed so as to provide corresponding p-channel MOSFETs.

As noted above, the UMOSFETs according to embodiments of the present invention may also be used in other devices such as, for example, IGBTs. As is known to those of skill in the art, an IGBT is a device that combines the high impedance gate of the power MOSFET with the small on-state conduction losses of a power BJT. An IGBT may be implemented, for example, as a Darlington pair that includes a high voltage n-channel MOSFET at the input and a BJT at the output. The MOSFET supplies the base current of the BJT. Since IGBTs are voltage controlled devices, they present minimal load to external drive circuits, yet have the high current density switching characteristics of a BJT.

Figure 4:
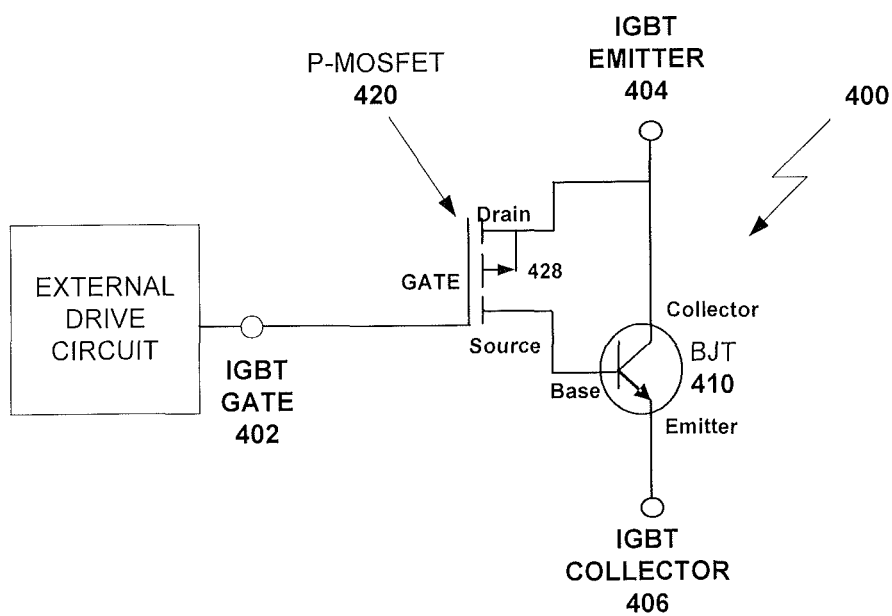
FIG. 4 is a simplified circuit diagram of a silicon carbide power n-channel IGBT that includes a UMOSFET according to embodiments of the present invention.
Figure 5A:
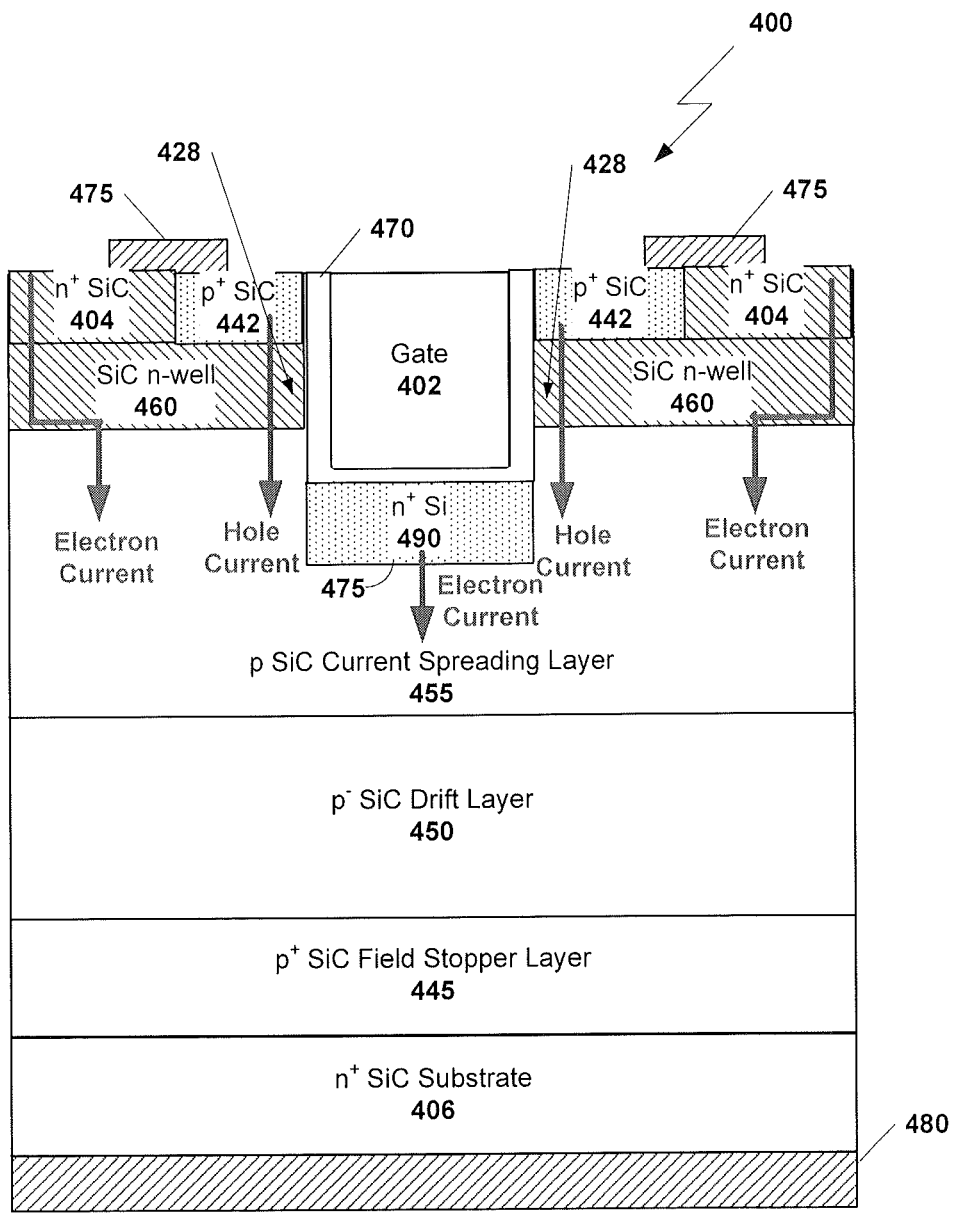
FIG. 5A is a schematic cross-sectional diagram of the IGBT of FIG. 4.

FIG. 4 is a simplified circuit diagram of a p-channel silicon carbide power IGBT 400 that includes a UMOSFET according to embodiments of the present invention. FIG. 5A is a schematic cross-sectional diagram of the IGBT 400 of FIG. 4.

As shown in FIG. 4, the IGBT 400 includes an NPN silicon carbide power BJT 410 that has a base, an emitter and a collector. The IGBT 400 further includes a silicon carbide power MOSFET 420 having a gate, a source and a drain. The source of the silicon carbide power MOSFET 420 is electrically connected to the base of the silicon carbide power BJT 410, and the drain of the silicon carbide power MOSFET 420 is electrically connected to the collector of the silicon carbide power BJT 410. By convention, the collector of the BJT 410 is the emitter 404 of the IGBT 400, and the emitter of the BJT 410 is the collector 406 of the IGBT 400, and the gate of the MOSFET 420 is the gate 402 of the IGBT 400.

The IGBT 400 may operate as follows. An external drive circuit is connected to the gate 402 of the IGBT 400 for applying a gate bias voltage to the power MOSFET 420. When this external drive circuit applies a voltage to the gate 402 of IGBT 400 that is greater than the threshold voltage of the MOSFET 420, an inversion layer is formed under the gate 402 which acts as a channel 428 that electrically connects the p$^+$ emitter 404 of the IGBT 400 to the base of BJT 410. Holes are injected from the p$^+$ emitter region 404 through the channel 428 into the base of BJT 410. This hole current acts as the base current that drives the BJT 410. In response to this hole current, electrons are injected from the collector 406 of IGBT 400 across the base of BJT 410 to the emitter 404 of IGBT 400. Thus, the silicon carbide power MOSFET 420 converts the silicon carbide power BJT 410 from a current driven device to a voltage driven device, which may allow for a simplified external drive circuit. The silicon carbide power MOSFET 420 acts as a driver transistor, and the silicon carbide power BJT 410 acts as the output transistor of the IGBT 400.

FIG. 5A is a schematic cross-sectional diagram of the IGBT 400 of FIG. 4. It will be appreciated that to form the power IGBT 400, the structure shown in FIG. 5A would typically comprise a single unit cell, of the IGBT 400, and a plurality of these unit cells would be implemented in parallel. To simplify the discussion below, it will be assumed that the IGBT 400 of FIG. 4 is implemented as the single unit cell illustrated in FIG. 5A.

As shown in FIG. 5A, the IGBT 400 may be formed on, for example, a heavily-doped single crystal n-type silicon carbide substrate 406. This n$^+$ substrate acts as the collector 406 of the IGBT 400 (and hence also as the emitter of the BJT 410). A p$^+$ silicon carbide field stopper layer 445 is provided on the substrate 406. A lightly p-type doped (p$^-$) silicon carbide drift layer 450 is provided on the field stopper layer 445. A moderately-doped p-type silicon carbide current spreading layer 455 is provided on the drift region 450. The p-type silicon carbide layers 445, 450, 455 act as the base of the BJT 410 and as the source region of the MOSFET 420. A pair of silicon carbide n-wells 460 are provided in an upper surface of the p-type silicon carbide current spreading layer 455. A p$^+$ silicon carbide drain region 442 is formed in an upper portion of each n-well 460. This p$^+$ silicon carbide drain region 442 acts as a common drain for the IGBT 400. A heavily-doped n$^+$ silicon carbide emitter region 404 (which also acts as the collector of the BJT 410) is formed in the upper portion of each n-well 460 adjacent the p$^+$ silicon carbide drain region 442. An ohmic contact 475 is formed to contact the n$^+$ silicon carbide emitter region 404 and the p$^+$ silicon carbide drain region 442, and an ohmic contact 480 is formed on the back side of the n$^+$ silicon carbide substrate 406. A "U" shaped gate insulating layer 470 such as a silicon dioxide layer is formed on the p-type silicon carbide current spreading layer 455 and on sidewalls of the n-wells 460. Finally, a gate electrode 402 such as, for example, a silicon carbide layer is formed on the gate insulating layer 470 that acts as the gate 402 of the IGBT 400. The gate electrode 402 may fill the interior of the insulating layer 470. A channel 428 of the MOSFET 420 is thereby defined in each of the n-wells 460 between the p$^+$ drain region 442 and the p-type current spreading layer 455. The gate insulating layer 470 and the gate electrode 460 together comprise a gate trench structure 476.

A heavily-doped (n$^+$) n-type silicon region 490 is provided beneath the gate electrode 402 underneath the bottom portion of the gate insulating layer 370. The heavily-doped (n$^+$) n-type silicon region 490 is electrically connected to the n-type silicon carbide emitter regions 404 by an electrical connection (not shown in FIG. 5A). The heavily-doped (n$^+$) n-type silicon region 490 forms a heterojunction with the underlying p-type silicon carbide current spreading layer 455.

Operation of the IGBT 400 will now be discussed. When a bias voltage that exceeds the threshold voltage of the MOSFET 420 is applied to the gate 402, a hole current flows across the channels 428 of MOSFET 420 into the base of the BJT 410, as indicated by the arrows labeled "hole current" in FIG. 5A. In response to this base current, an electron current flows from the heavily-doped n-type emitter region 404 of the IGBT 400 through the n-wells 460 to the collector 406 of the IGBT 400.

Figure 5B:
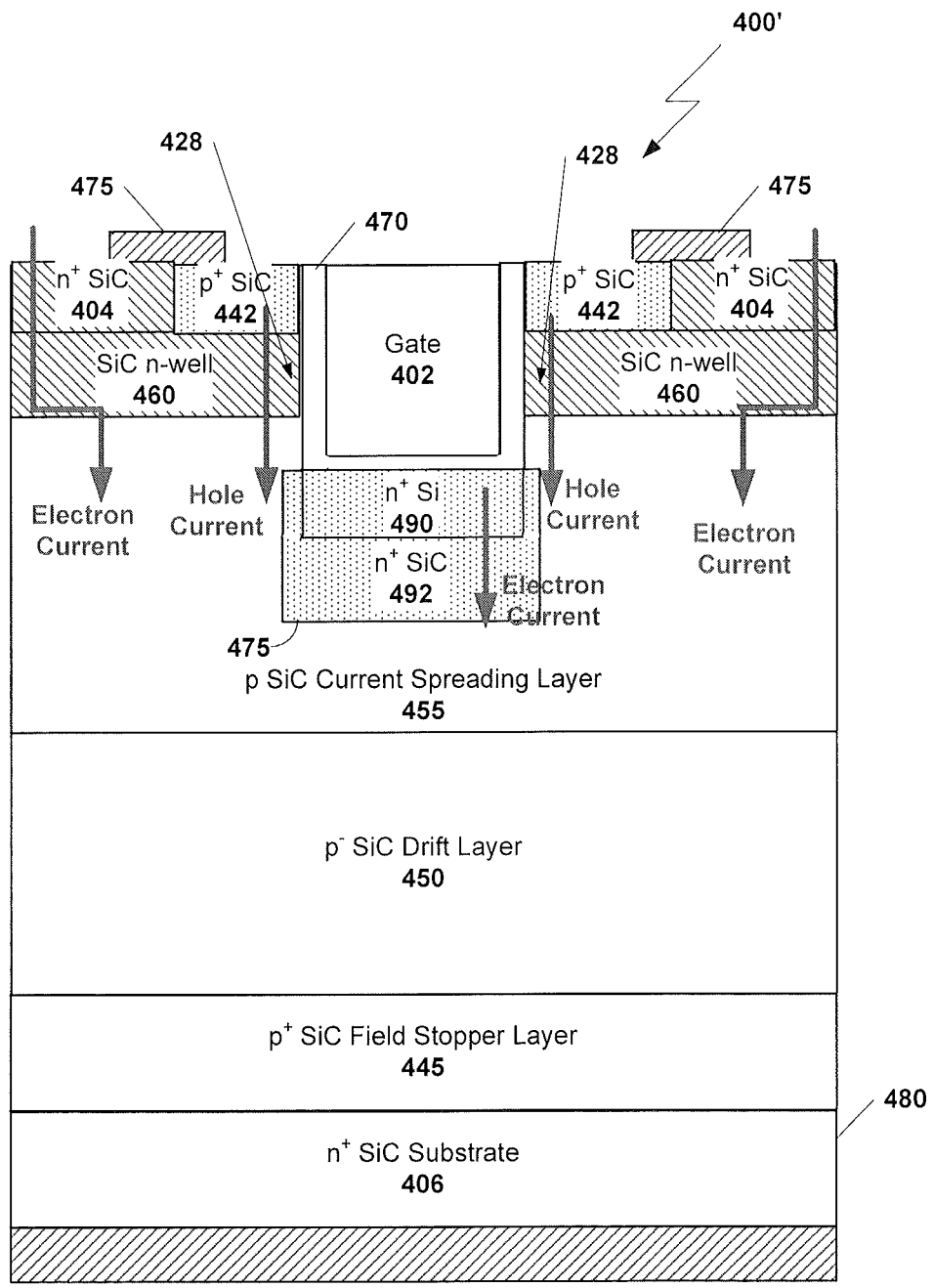
FIG. 5B is a schematic cross-sectional diagram of a modified version of the of the IGBT of FIG. 5A.

FIG. 5B is a schematic cross-sectional diagram of an IGBT 400' according to further embodiments of the present invention. The IGBT 400' may be identical to the IGBT 400 of FIG. 5A, except that it further includes a heavily-doped n-type silicon carbide region 492 between the heavily-doped (n$^+$) n-type silicon region 490 and the p-type silicon carbide current spreading layer 455. As discussed above, by providing this n-type silicon carbide region 492 between the n$^+$ silicon region 490 and the current spreading layer 455, a p-n junction may be formed between the n$^+$ silicon region 490 and the current spreading layer 455 as opposed to a Schottky contact as is the case in the device of FIG. 5A, and thus the device of FIG. 5B may exhibit reduced leakage currents.

While FIGS. 5A and 5B each illustrate the structure of a p-channel IGBT, it will be appreciated that pursuant to further embodiments of the present invention, the polarity of each of the semiconductor layers in each device could be reversed so as to provide corresponding n-channel IGBTs according to further embodiments of the present invention.

As discussed above, the power MOSFETs and IGBTs and other devices according to embodiments of the present invention which include, for example, a silicon/silicon carbide heterojunction underneath the gate trench, may shield the off-state electrical field from the corners of the trench structure, which may improve both device stability and/or manufacturing yields.

As is known to those of skill in the art, IGBTs may include a parasitic thyristor. In particular, as current flows through an IGBT, a voltage difference appears across the p-n junction formed by each well region and its associated drain region (e.g., n-well 460 and p-type drain region 442 of FIGS. 5A and 5B). Once this voltage difference reaches a threshold amount (e.g., about 2.7 volts in a typical silicon carbide IGBT), the p-n junction formed between the well region and the drain region of the device turns on. Once this has occurred, the current will continue to flow from the emitter to the collector even if the bias voltage that is applied to the gate is removed. Consequently, the IGBT can only be used at current densities that are less than the current density required to turn on the well region-drain region p-n junction, as once that threshold current density is reached, the ability to use the gate electrode of the IGBT to control the current flow through the device is lost. This condition is commonly referred to as "latch-up" of the parasitic thyristor, and when it occurs, it usually leads to the destruction of the device. Consequently, care must be taken to limit the on-state current densities through an IGBT in order to avoid latch-up of the parasitic thyristor.

Several techniques for reducing the occurrence of latch-up have been utilized in silicon IGBT technology, typically at a cost in terms of on-state voltage drop and/or switching speed. These techniques include, for example, providing higher well doping concentrations, minority carrier by-pass, and providing an IGBT cell with a diverter. Typically, the diverter is realized by providing a minority carrier current conduction path through the transistor. In silicon carbide, however, due to the high (e.g., greater than 2.7 V) built-in potential of the collector-base junction in the bipolar junction transistor, the cell pitch of the IGBT must be large enough to reduce the JFET resistance of the device. Thus, the channel density is reduced.

While silicon-based IGBTs have limitations in terms of controllable current density, electron mobility in silicon is typically 2-3 times the hole mobility, whereas in the drift region of a 4H—SiC-based IGBT, the electron mobility will typically be more than 10 times the hole mobility. As a result, in silicon carbide IGBTs, the vast majority of the current comprises electron current. Thus, silicon carbide IGBTs are inherently more prone to latch-up than are silicon-based IGBTs because the current flowing through the well regions that cause this latch up builds more quickly due to the pronounced difference in electron and hole mobilities in silicon carbide.

An additional benefit of heavily-doped n-type silicon layer 490 that is provided in the IGBTs 400, 400' of FIGS. 5A and 5B is that this silicon layer 490 may act as a minority carrier diversion path or "minority carrier diverter." In particular, the silicon layer 490 may provide a conduction path that may carry a significant percentage (e.g., 50 percent) of the minority carrier current through the device, thereby reducing the current flow through the well region-drain region p-n junction so as to allow larger on-state current densities without latch-up of the parasitic thyristor. Consequently, the silicon carbide IGBTs according to embodiments of the present invention may have increased controllable current densities. While a silicon carbide region could be formed under the gate of the device to provide such a minority current diversion path, doing so would greatly increase the cell pitch of the device. By providing a silicon n-well as a minority current diversion path in a silicon carbide IGBT, a small cell pitch can maintained.

The heavily-doped n-type silicon layer 490 also reduces the degree to which the gate electrode 402 directly overlaps the p-type current spreading layer 455 through the gate insulating layer 470. As a result, by including the heavily-doped n-type silicon layer 490, it is possible to reduce the power that the gate drive circuitry must provide to turn on the IGBT. Thus, for a constant gate drive, the IGBTs according to embodiments of the present invention may provide increased switching speed.

Figure 6A:
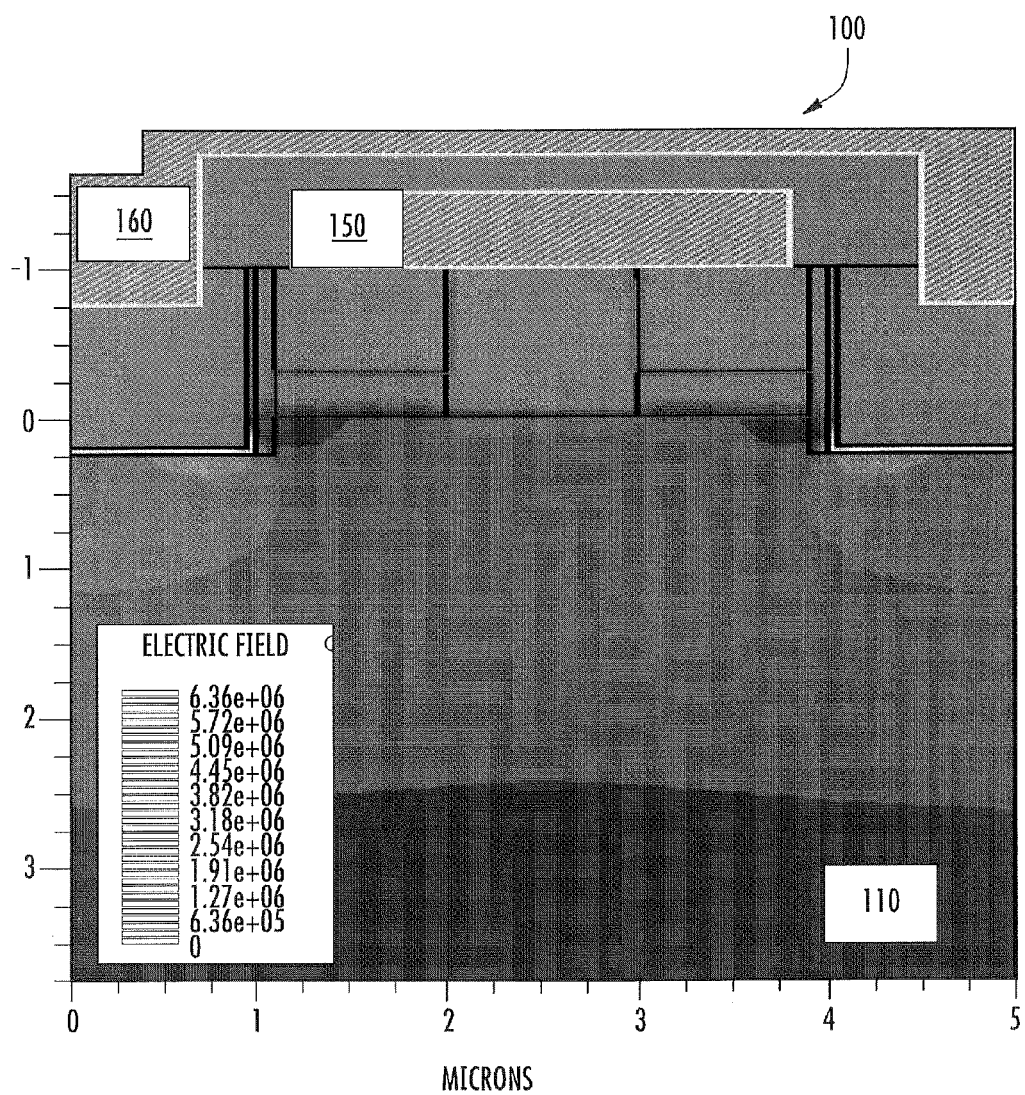
FIGS. 6A and 6B are cross-sectional diagrams that illustrate the simulated electrical field intensity (at a substrate voltage of 1200 volts) for both the power MOSFET having the structure of FIG. 1 and a MOSFET according to embodiments of the present invention having the structure of FIG. 2A.
Figure 6B:
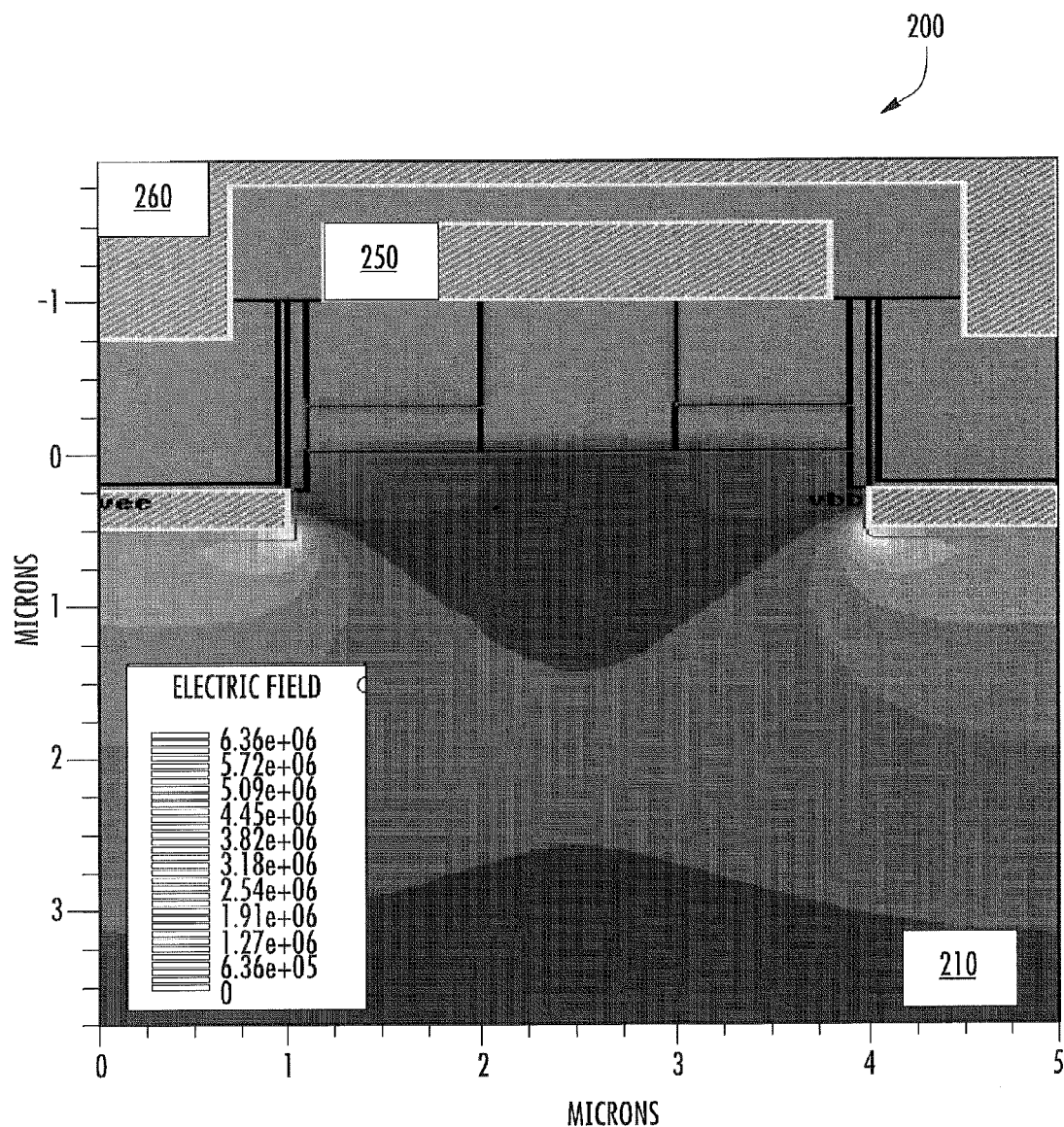
Figure 7A:
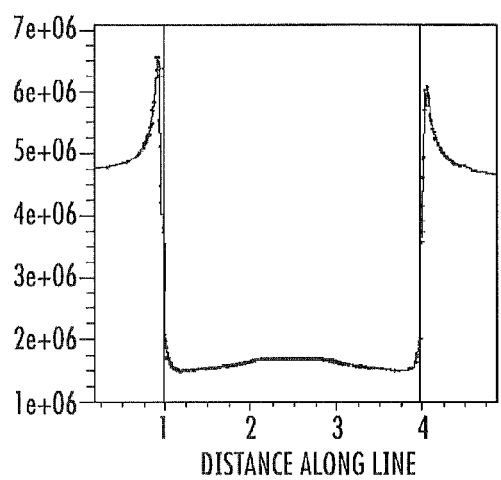
FIGS. 7A and 7B are graphs showing the simulated electrical field distributions along the cross section of the silicon carbide UMOSFET of FIG. 6A and the UMOSFET according to embodiments of the present invention of FIG. 6B, respectively.
Figure 7B:
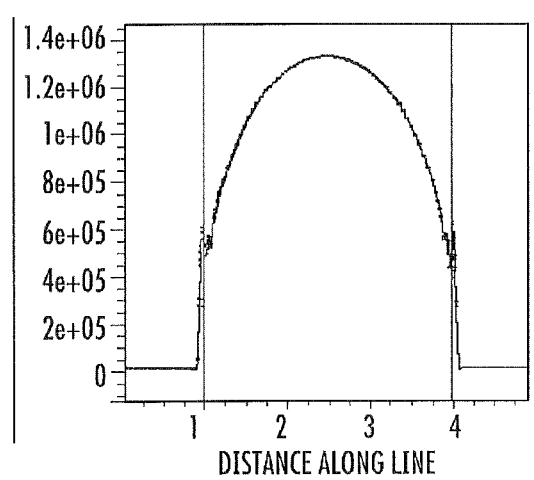

FIGS. 6A and 6B are cross-sectional diagrams that illustrate the simulated electrical field intensity (at a substrate voltage of 1200 volts) for both the power MOSFET having the structure of FIG. 1 and a MOSFET according to embodiments of the present invention having the structure of FIG. 2A. FIGS. 7A and 7B are graphs showing the simulated electrical field distributions along the cross section of the silicon carbide UMOSFET of FIG. 6A and the UMOSFET according to embodiments of the present invention of FIG. 6B.

As shown in FIGS. 6A and 7A, in the UMOSFET shown therein the electric field under the gate electrode has a value exceeding $4.5 \times 10^6$ V/cm in the middle portion of the drift region 120 under the gate electrode, and electric field spikes to a value of approximately $6.5 \times 10^6$ V/cm at each corner of the trench structure. In contrast, as shown in FIGS. 6B and 7B, in the UMOSFET according to embodiments of the present invention, the electric field is nearly eliminated under the gate electrode, and the electric field is reduced under the p-wells 240 as well.

Pursuant to further embodiments of the present invention, methods of forming UMOSFETs according to embodiments of the present invention are provided, as well as methods of forming devices that include such UMOSFETs. For example FIGS. 8A-8G illustrate a method of forming a silicon carbide UMOSFET having a silicon-silicon carbide heterojunction under the gate trench according to some embodiments of the present invention.

Figure 8A:
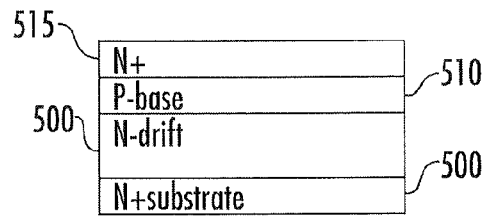
FIGS. 8A-8G are schematic cross-sectional diagrams illustrating methods of forming a UMOSFET according to certain embodiments of the present invention.

As shown in FIG. 8A, operations may begin with the formation of a lightly-doped n-type silicon carbide drift layer 505 on an n-type silicon carbide substrate 500. Next, a p-type silicon carbide layer 510 may be formed on top of the drift layer 505 that will be used to form p-wells in subsequent processing steps. Finally, a heavily-doped n-type silicon carbide layer 515 may be formed on top of the p-type silicon carbide layer 510. The layers 505, 510 and 515 may all be grown via epitaxial growth in a growth reactor, and the resulting structure may be removed from the growth reactor for subsequent processing.

Figure 8B:
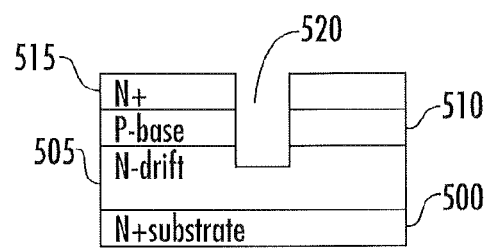

As shown in FIG. 8B, a trench 520 may be formed that penetrates the heavily-doped n-type silicon carbide layer 515, the p-type silicon carbide layer 510 and an upper portion of the n-type silicon carbide drift layer 505. This trench may be formed by forming a mask layer (not shown) on the upper surface of the heavily-doped n-type silicon carbide layer 515, using a photolithography process to pattern the mask to expose the area where the trench 520 is to be formed, and then performing an anisotropic etching process to selectively etch the device, thereby forming the trench 520. The mask layer (not shown) may then be removed.

Figure 8C:
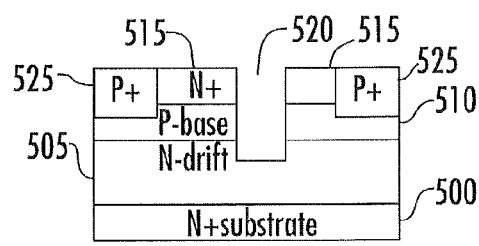

Referring to FIG. 8C, another mask may then be formed on an upper surface of the device and patterned to expose areas where heavily-doped p-type regions 525 are to be formed. An ion implantation process may then be performed to implant p-type dopants into the heavily-doped p-type regions 525.

The structure may then be annealed at a temperature of, for example, 1600° C. in order to activate the p-type dopants.

Figure 8D:
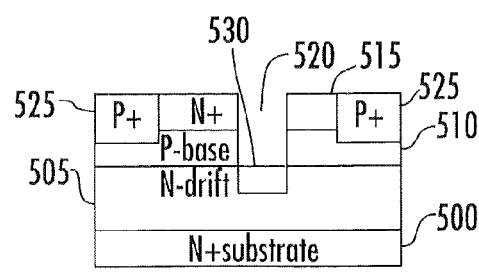

Referring to FIG. 8D, next, a heavily-doped p-type silicon layer 530 may be fanned in the bottom of the trench 520. One possible method of forming this layer is discussed in detail below with reference to FIGS. 9A-9E.

Figure 8E:
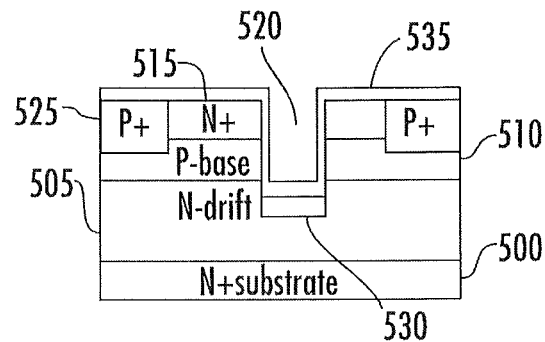

Next, as shown in FIG. 8E, a gate dielectric film 535 may be formed on the upper surface of the device and in the gate trench 520, including on an upper surface of the silicon layer 530. The gate dielectric film may be formed, for example, by performing a heat treatment in an environment that includes oxygen in order to form a silicon dioxide gate dielectric film 535.

Figure 8F:
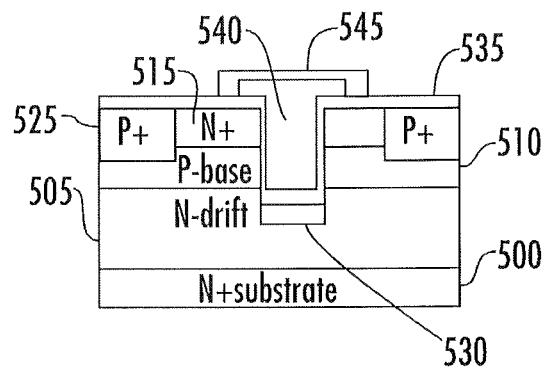
Figure 8G:
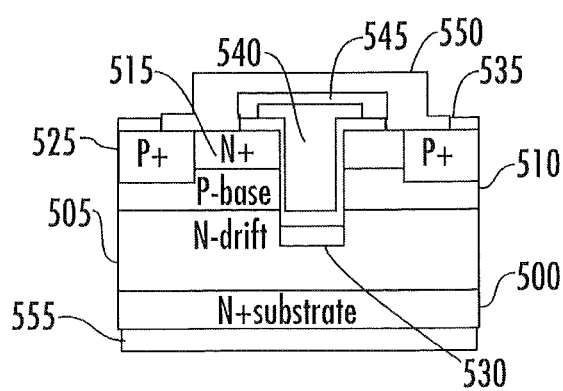

Referring to FIG. 8F, next, a polysilicon gate electrode 540 is formed in the gate trench 520. The gate electrode 540 may be formed in a conventional fashion. Then, a passivation layer 545 such as, for example, a silicon dioxide layer, is formed on the upper surface of the device. Then, referring to FIG. 8G, the passivation layer 545 may be patterned in a conventional fashion, and then a source contact 550 may be formed that contacts the heavily doped n-type source regions 515 and the heavily-doped p-type regions 525. A drain contact 555 may be formed on the back side of the silicon carbide substrate 500 to complete fabrication of the device. The contacts 550, 555 may comprise, for example, metal contacts.

Figure 9A:
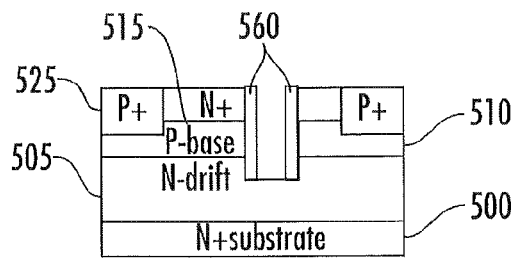
FIGS. 9A-9E illustrate a method of forming a p-type silicon layer in the bottom of a gate trench according to certain embodiments of the present invention.
Figure 9B:
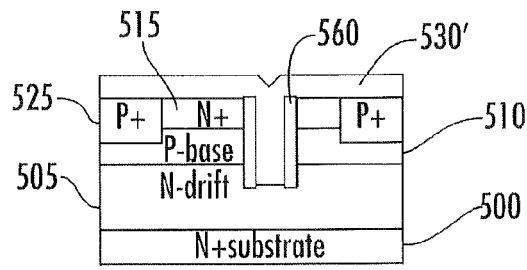

FIGS. 9A-9E illustrate one possible method of forming the heavily-doped p-type silicon layer 530 illustrated in FIGS. 8D-8G above in the bottom of the trench 520. Referring to FIG. 9A, a thin oxide layer 560 may be formed on sidewalls and a bottom surface of the gate trench 520. An etch back process such as, for example, an anisotropic etch may then be used to remove the portion of the oxide layer 560 that is on the bottom of the gate trench to expose the drift layer 505. Next, referring to FIG. 9B, a p-type polysilicon layer 530' may be formed on the structure and within the gate trench 520. The polysilicon layer 530' may grow from the oxide layer 560 that is formed on the sidewalls of the gate trench 520 to fill the gate trench 520. Next, a planarization process such as, for example, an etch back process or a chemical-mechanical processing process may be performed to remove the polysilicon from the upper surface of the structure while leaving the polysilicon in the gate trench 520, thereby converting the polysilicon layer 530' into a polysilicon pattern 530".

Figure 9C:
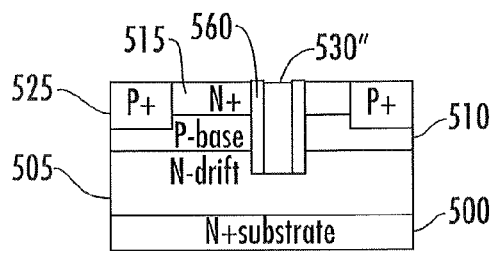

Referring to FIG. 9C, a thermal oxidation process followed by a BOE (buffered oxide etch) wet etching process may then be performed to remove a portion of the polysilicon pattern 530" that is in the gate trench 520 to form the polysilicon region 530. During this etching process, voltage probing may be performed to determine when a sufficient amount of the polysilicon pattern 530" has been removed such that an upper surface of the polysilicon pattern 530" is below a lower surface of the p-type silicon carbide layer 510. In particular, in a test region of the wafer, the p-well 510 may be left exposed and a first probe may contact the p-well 510 in this exposed region. Another probe may contact the polysilicon pattern 530" that is in the gate trench 520. As the etching of the polysilicon pattern 530" is performed, the voltage-current characteristics across the two probes is monitored. So long as the top surface of the polysilicon pattern 530" is above the bottom surface of the p-wells 510, the probes will measure across a p-type to p-type interface between the p-well 510 and the p-type polysilicon pattern 530". However, when the top surface of the polysilicon pattern 530" is etched sufficiently to fall below the bottom surface of the p-wells 510, the probes will measure across a p-n junction between the n-type drift layer 505 and the p-type polysilicon pattern 530". This will cause a change in the measured I-V characteristics, and hence the probes may be used to determine when the upper surface of the polysilicon pattern 530" has been sufficiently etched to be below a lower surface of the p-type silicon carbide layer 510. Once the voltage probing indicates that a polarity change has occurred, the polysilicon pattern 530" may be further etched for a small distance (e.g., about 0.3 microns) to make sure that the top surface of the p-type polysilicon pattern 530" is below the lower surface of the p-type silicon carbide layer 510. At this point, the etching process is stopped, and the polysilicon pattern 530" has been converted into the polysilicon region 530.

Figure 9D:
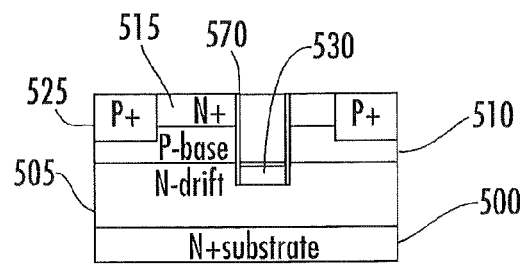

Referring to FIG. 9D, the oxide layer 560 on the sidewalls of the gate trench 520 may then be removed by, for example, an isotropic etching process. Next, a gate oxide layer 570 may be formed on the polysilicon layer 530 and on sidewalls of the gate trench 520 by, for example, heating the structure in an oxygen environment.

Figure 9E:
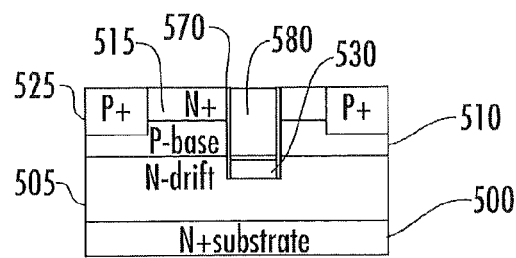

Referring to FIG. 9E, next, a gate electrode 580 may be formed to fill the remainder of the gate trench 520. The gate electrode 580 may comprise, for example, a polysilicon layer. It should be noted that the method for forming the semiconductor device will also include providing an electrical connection between the polysilicon layer 530 and the source contact 515.

It will be appreciated that while FIGS. 8A-9E illustrate one of way of forming a MOSFET according to embodiments of the present invention, many other methods could be used. Finally, while FIGS. 8A-9E illustrate a method of forming a UMOSFET according to embodiments of the present invention, it will be appreciated that the operations disclosed therein may be suitably modified to form other devices such as, for example, the IGBT 400 of FIGS. 4, 5A and 5B.

Figure 10A:
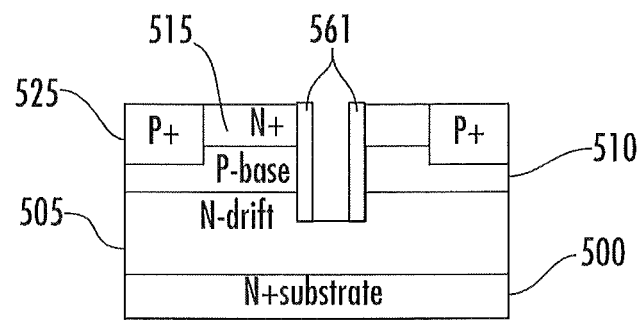
FIGS. 10A-10C illustrate a method of forming a p-type silicon layer in the bottom of a gate trench according to further embodiments of the present invention.
Figure 10B:
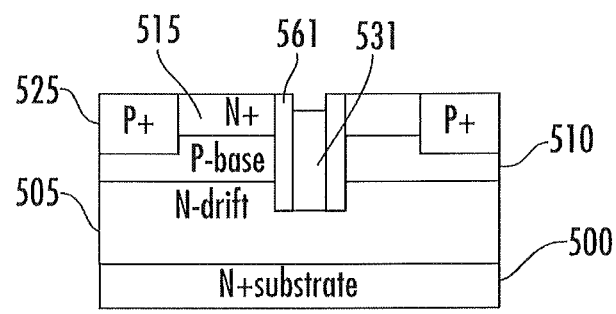
Figure 10C:
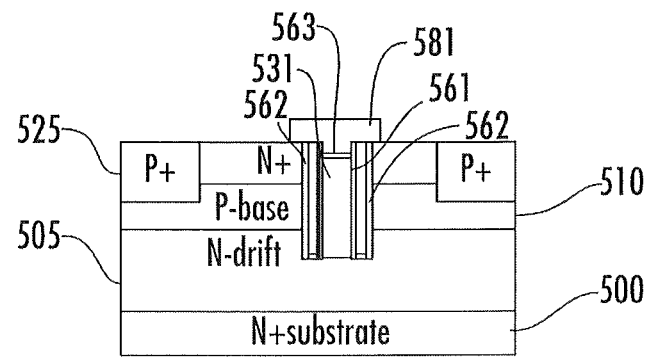

FIGS. 10A-10C illustrate one possible method of forming the gate structure 375 of FIG. 3A. The operations shown in FIGS. 10A-10C may begin after the operations shown in FIG. 8C and may replace the operations illustrated with respect to FIGS. 8D-8F.

As shown in FIG. 10A, a thin oxide layer 561 may be formed on sidewalls and a bottom surface of the gate trench 520. An etch back process such as, for example, an anisotropic etch may then be used to remove the portion of the oxide layer 561 (not shown in FIG. 10A) that is on the bottom of the gate trench to expose the drift layer 505. Next, referring to FIG. 10B, a p-type polysilicon layer (not shown) may be formed on the structure and within the gate trench 520. The polysilicon layer may grow from the oxide layer 561 that is formed on the sidewalls of the gate trench 520 to fill the gate trench 520. Next, a planarization process such as, for example, an etch back process may be performed to remove the polysilicon from the upper surface of the structure and from an upper portion of the gate trench 520, thereby converting the polysilicon layer into a polysilicon pattern 531. There is no need to perform the probing discussed above with respect to the method of FIGS. 9A-9D during this etch back process.

Referring to FIG. 10C, a wet etching process may then be performed on the oxide layer 561 on the sidewalls of the gate trench 520 to form trenches 562 in the oxide layer 561. These trenches 562 may be formed by, for example, an anisotropic etching process. Next, an oxide layer 563 may be formed on the surface of the polysilicon pattern 531. Then, a gate electrode 581 may be formed in each trench 562 and on top of the oxide layer 563. The gate electrode 581 may comprise, for example, a polysilicon layer. It should be noted that the method for forming the semiconductor device will also include providing an electrical connection between the polysilicon pattern 531 and the source contact 515.

It will be appreciated that numerous changes may be made to exemplary embodiments discussed above without departing from the scope of the present invention. For example, while all of the above embodiments use silicon carbide as the wide band-gap semiconductor, it will be appreciated that, in other embodiments, a different wide band-gap semiconductor could be used. Likewise, it will be appreciated that in other embodiments the heterojunction that is under the gate trench may be formed of a material other than polysilicon such as, for example, single-crystalline silicon, silicon-germanium, etc.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor switching device, comprising:
a first wide band-gap semiconductor layer having a first conductivity type;
a first wide band-gap well region having a second conductivity type that is opposite the first conductivity type on the first wide band-gap semiconductor layer;
a second wide band-gap well region having the second conductivity type on the first wide band-gap semiconductor layer;
a non-wide band-gap semiconductor layer having the second conductivity type on the first wide band-gap semiconductor layer;
a first wide band-gap source/drain region having the first conductivity type on the first wide band-gap well region;
a second wide band-gap source/drain region having the first conductivity type on the second wide band-gap well region;
a gate insulation layer on the non-wide band-gap semiconductor layer; and
a gate electrode on the gate insulation layer,
wherein the gate insulation layer directly contacts the first wide band-gap well region.

2. The semiconductor switching device of claim 1, wherein the non-wide band-gap semiconductor layer is directly on the first wide band-gap semiconductor layer so as to form a heterojunction with the first wide band-gap semiconductor layer.

3. The semiconductor switching device of claim 2, wherein the heterojunction has a first built-in potential that is lower than a second built-in potential of a homojunction formed between the first wide band-gap semiconductor layer and the first wide band-gap well region.

4. The semiconductor switching device of claim 1, wherein the first wide band-gap semiconductor layer comprises a wide band-gap drift layer.

5. The semiconductor switching device of claim 1, further comprising a wide band-gap current spreading layer below a bottom surface of the first wide band-gap semiconductor layer, wherein the first wide band-gap semiconductor layer comprises a wide band-gap drift layer.

6. The semiconductor switching device of claim 1, wherein the non-wide band-gap semiconductor layer comprises a polysilicon layer.

7. The semiconductor switching device of claim 6, wherein the first wide band-gap semiconductor layer comprises an n-type silicon carbide drift layer, wherein the first and second wide band-gap well regions comprise first and second p-type silicon carbide well regions, wherein the first and second wide band-gap source/drain regions comprise first and second n-type silicon carbide source/drain regions, and wherein the silicon layer comprises a p-type silicon layer.

8. The semiconductor switching device of claim 7, wherein the device further comprises a silicon carbide substrate on the n-type silicon carbide drift layer opposite the first and second p-type silicon carbide well regions.

9. The semiconductor switching device of claim 8, wherein the gate insulation layer is on a top surface of the non-wide band-gap semiconductor layer, and the gate electrode is on a top surface of the gate insulation layer.

10. The semiconductor switching device of claim 9, wherein the silicon carbide substrate comprises an n-type silicon carbide substrate, and the semiconductor switching device comprises a silicon carbide power MOSFET.

11. The semiconductor switching device of claim 9, wherein the silicon carbide substrate comprises a silicon carbide substrate, and the semiconductor switching device comprises a silicon carbide insulated gate bipolar junction transistor ("IGBT").

12. The semiconductor switching device of claim 1, further comprising a second wide band-gap semiconductor region having the second conductivity type between the first wide band-gap semiconductor layer and the non-wide band-gap semiconductor layer, wherein the second wide band-gap semiconductor region having the second conductivity type and the non-wide band-gap semiconductor layer form a heterojunction.

13. The semiconductor switching device of claim 1, further comprising an electrical connection between the non-wide band-gap semiconductor layer and the first and second wide band-gap source/drain regions.

14. The semiconductor switching device of claim 1, wherein a bottom surface of the first wide band-gap well region is on a top surface of the first wide band-gap semiconductor layer, and wherein a bottom surface of the gate electrode is positioned below a top surface of the first wide band-gap well region and below a top surface of the second wide band-gap well region.

15. The semiconductor switching device of claim 1, wherein the non-wide band-gap semiconductor layer does not directly contact either the first wide band-gap well region or the second wide band-gap well region.

16. The semiconductor switching device of claim 1, wherein the gate insulation layer is on a side surface of the first wide band-gap well region and on a side surface of the second wide band-gap well region, the semiconductor switching device further comprising a first channel that extends from a top surface of the first wide band-gap well region to the bottom surface of the first wide band-gap well region and a second channel that extends from a top surface of the second wide band-gap well region to the bottom surface of the second wide band-gap well region.

17. The semiconductor switching device of claim 1, wherein the gate insulation layer directly contacts the first wide band-gap well region.

18. A semiconductor switching device, comprising:
a first wide band-gap semiconductor layer having a first conductivity type;
a first wide band-gap well region having a second conductivity type that is opposite the first conductivity type on a top surface of the first wide band-gap semiconductor layer;
a second wide band-gap well region having the second conductivity type on the top surface of the first wide band-gap semiconductor layer;
a non-wide band-gap semiconductor layer having the second conductivity type on or within the first wide band-gap semiconductor layer;
a first wide band-gap source/drain region having the first conductivity type on the first wide band-gap well region;
a second wide band-gap source/drain region having the first conductivity type on the second wide band-gap well region;
a gate insulation layer on the non-wide band-gap semiconductor layer; and
a gate electrode on the gate insulation layer,
wherein a top surface of the non-wide band-gap semiconductor layer is closer to a bottom surface of the first wide band-gap semiconductor layer than are bottom surfaces of the first and second wide band-gap well regions.

19. The semiconductor switching device of claim 18, wherein the gate insulation layer is on a side surface of the first wide band-gap well region and on a side surface of the second wide band-gap well region, the semiconductor switching device further comprising a first channel that extends from a top surface of the first wide band-gap well region to the bottom surface of the first wide band-gap well region and a second channel that extends from a top surface of the second wide band-gap well region to the bottom surface of the second wide band-gap well region.

20. The semiconductor switching device of claim 18, wherein the non-wide band-gap semiconductor layer does not directly contact either the first wide band-gap well region or the second wide band-gap well region.

21. The semiconductor switching device of claim 18, wherein the gate insulation layer directly contacts the first wide band-gap well region.

22. The semiconductor switching device of claim 18, further comprising a second wide band-gap region having the second conductivity type interposed between the non-wide band-gap semiconductor layer and the first wide band-gap semiconductor layer.

23. The semiconductor switching device of claim 18, further comprising a wide band-gap current spreading layer adjacent a top surface of the first wide band-gap semiconductor layer that has a higher doping concentration than the first wide band-gap semiconductor layer.

24. A semiconductor switching device, comprising:
a first wide band-gap semiconductor layer having a first conductivity type;
a first wide band-gap well region having a second conductivity type that is opposite the first conductivity type on a top surface of the first wide band-gap semiconductor layer;
a second wide band-gap well region second conductivity type on the top surface of the first wide band-gap semiconductor layer;
a non-wide band-gap semiconductor layer having the second conductivity type on the first wide band-gap semiconductor layer,
a first wide band-gap source/drain region having the first conductivity type on the first wide band-gap well region;
a second wide band-gap source/drain region having the first conductivity type on the second wide band-gap well region;
a gate insulation layer on the non-wide band-gap semiconductor layer; and
a gate electrode on the gate insulation layer,
wherein the gate insulation layer is between the non-wide band-gap semiconductor layer and the first wide band-gap well region and between the non-wide band-gap semiconductor layer and the second wide band-gap well region, and the gate electrode is disposed within a first recess in a first portion of the gate insulation layer that is between the non-wide band-gap semiconductor layer and the first wide band-gap well region and within a second recess in a second portion of the gate insulation layer that is between the non-wide band-gap semiconductor layer and the second wide band-gap well region.

25. A method of forming a semiconductor device, comprising:
providing a first wide band-gap semiconductor layer having a first conductivity type on a substrate;
providing a second wide band-gap semiconductor layer having a second conductivity type that is opposite the first conductivity type on the first wide band-gap semiconductor layer;
providing a gate trench that penetrates the second wide band-gap semiconductor layer and a portion of the first wide band-gap semiconductor layer, wherein the gate trench divides the second wide band-gap semiconductor layer into a first wide band-gap well region and a second wide band-gap well region;
providing a first wide band-gap source/drain region having the first conductivity type on the first wide band-gap well region;
providing a second wide band-gap source/drain region having the first conductivity type on the second wide band-gap well region; and
providing a non-wide band-gap semiconductor layer having the second conductivity type in the gate trench and on the first wide band-gap semiconductor layer.

26. The method of claim 25, wherein providing the first and second wide band-gap source/drain regions comprises forming a third wide band-gap semiconductor layer region having the first conductivity type on the second wide band-gap semiconductor layer, and dividing the third wide band-gap semiconductor layer region into the first and second wide band-gap source/drain regions by the formation of the gate trench.

27. The method of claim 25, wherein providing the first and second wide band-gap source/drain regions comprises implanting ions having the first conductivity type into first and second upper portions of the second wide band-gap semiconductor layer.

28. The method of claim 25, further comprising providing a gate insulation layer on sidewalls of the gate trench and on the non-wide band-gap semiconductor layer, and providing a gate electrode on the gate insulation layer.

29. The method of claim 28, wherein the non-wide band-gap semiconductor layer is provided directly on the first wide band-gap semiconductor layer so as to form a heterojunction with the first wide band-gap semiconductor layer.

30. The method of claim 29, wherein the non-wide band-gap semiconductor layer comprises a silicon layer.

31. The method of claim 30, wherein the first wide band-gap semiconductor layer comprises an n-type silicon carbide drift layer or an n-type current spreading layer, wherein the first and second wide band-gap well regions comprise first and second p-type silicon carbide well regions, wherein the first and second wide band-gap source/drain regions comprise first and second n-type silicon carbide source/drain regions, and wherein the silicon layer comprises a p-type silicon layer.

32. The method of claim 31, wherein the substrate comprises an n-type silicon carbide substrate, and the semiconductor switching device comprises a silicon carbide power MOSFET.

33. The method of claim 31, wherein the substrate comprises a p-type silicon carbide substrate, and the semiconductor switching device comprises a power silicon carbide insulated gate bipolar junction transistor ("IGBT").

34. The method of claim 25, further comprising providing a third wide band-gap semiconductor region having the second conductivity type on the first wide band-gap semiconductor layer prior to providing the non-wide band-gap semiconductor layer, wherein the non-wide band-gap semiconductor layer is on the third wide band-gap semiconductor region, and wherein the third wide band-gap semiconductor region and the non-wide band-gap semiconductor layer form a heterojunction.

35. The method of claim 25, further comprising providing an electrical connection between the non-wide band-gap semiconductor layer and the first and second wide band-gap source/drain regions.

36. A semiconductor device, comprising:
a first wide band-gap semiconductor layer;
a gate insulation layer on the first wide band-gap semiconductor layer;
a gate electrode adjacent the gate insulation layer;
a non-wide band-gap semiconductor pattern that is on the first wide band-gap semiconductor layer;
a first wide band-gap semiconductor well region having the second conductivity type on a top surface of the first wide band-gap semiconductor layer, the first wide band-gap semiconductor well region including a first channel region therein; and
a second wide band-gap semiconductor well region having the second conductivity type on the top surface of the first wide band-gap semiconductor layer, the second wide band-gap semiconductor well region including a second channel region therein,
wherein a bottom surface of the non-wide band-gap semiconductor pattern is closer to a bottom surface of the first wide band-gap semiconductor layer than are the first and second channel regions.

37. The semiconductor device of claim 36, wherein the non-wide band-gap semiconductor pattern is directly on the first wide band-gap semiconductor layer so as to form a heterojunction with the first wide band-gap semiconductor layer.

38. The semiconductor device of claim 37, wherein the gate electrode includes opposed sidewalls, and wherein at least a portion of the non-wide band-gap semiconductor pattern is between the opposed sidewalls of the gate electrode.

39. The semiconductor device of claim 37, wherein the gate electrode is at least partially positioned within a gate trench that extends below a top surface of the first wide band-gap semiconductor well region and below a top surface of the second wide band-gap semiconductor well region so that a bottom portion of the gate electrode is positioned in a bottom portion of the gate trench between the first and second wide band-gap semiconductor well regions, and wherein the non-wide band-gap semiconductor pattern is positioned between the bottom portion of the gate electrode and the first wide band-gap semiconductor layer.

40. The semiconductor device of claim 36, wherein the first wide band-gap semiconductor layer has a first conductivity type, and wherein the non-wide band-gap semiconductor pattern has a second conductivity type that is different from the first conductivity type.

41. The semiconductor device of claim 40, further comprising a wide band-gap semiconductor pattern having the second conductivity type between at least a portion of the first wide band-gap semiconductor layer and the non-wide band-gap semiconductor pattern, wherein the second wide band-gap semiconductor pattern and the non-wide band-gap semiconductor pattern form a heterojunction, wherein wide band-gap semiconductor pattern having the second conductivity type is positioned closer to the bottom surface of the first wide band-gap semiconductor layer than are the first and second wide band-gap semiconductor well regions.

42. The semiconductor device of claim 40, further comprising:
a first wide band-gap semiconductor source/drain region having the first conductivity type on the first wide band-gap semiconductor well region; and
a second wide band-gap semiconductor source/drain region having the first conductivity type on the second wide band-gap semiconductor well region.

43. The semiconductor device of claim 42, further comprising an electrical connection between the non-wide band-gap semiconductor pattern and the first and second wide band-gap semiconductor source/drain regions.

44. The semiconductor switching device of claim 36, wherein the non-wide band-gap semiconductor pattern comprises a silicon pattern, and wherein the first wide band-gap semiconductor layer comprises a silicon carbide layer.

45. The semiconductor switching device of claim 36, wherein a bottom surface of the non-wide band-gap semiconductor layer is closer to a bottom surface of the first wide band-gap semiconductor layer than is a bottom surface of the first wide band-gap well region.

46. The semiconductor switching device of claim 36, wherein the first wide band-gap well region is on a top surface of the first wide band-gap semiconductor layer and the gate insulating layer is on a side surface of the first wide band-gap well region and on a side surface of the second wide band-gap well region, the semiconductor switching device further comprising a first channel that extends from a top surface of the first wide band-gap well region to the bottom surface of the first wide band-gap well region and a second channel that extends from a top surface of the second wide band-gap well region to the bottom surface of the second wide band-gap well region.

47. The semiconductor switching device of claim 36, wherein the gate insulation layer directly contacts the first wide band-gap well region.

48. The semiconductor switching device of claim 36, wherein a bottom surface of the non-wide band-gap semiconductor layer is closer to a bottom surface of the first wide band-gap semiconductor layer than is a bottom surface of the first wide band-gap well region.

49. The semiconductor device of claim 36, wherein the non-wide band-gap semiconductor pattern that is between the first wide band-gap semiconductor layer and at least a portion of the gate insulation layer.

* * * * *